US012581877B2

(12) United States Patent
Sharma et al.

(10) Patent No.:  US 12,581,877 B2
(45) Date of Patent:  Mar. 17, 2026

(54) SELECTIVE DEPOSITION OF METAL OXIDES USING SILANES AS AN INHIBITOR

(71) Applicant: Lam Research Corporation, Fremont, CA (US)

(72) Inventors: Kashish Sharma, Tigard, OR (US); Paul C. Lemaire, Portland, OR (US); Dennis M. Hausmann, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 392 days.

(21) Appl. No.: 18/245,939

(22) PCT Filed: Sep. 23, 2021

(86) PCT No.: PCT/US2021/051639
§ 371 (c)(1),
(2) Date: Mar. 20, 2023

(87) PCT Pub. No.: WO2022/066830
PCT Pub. Date: Mar. 31, 2022

(65) Prior Publication Data
US 2023/0386831 A1      Nov. 30, 2023

Related U.S. Application Data

(60) Provisional application No. 63/198,060, filed on Sep. 25, 2020.

(51) Int. Cl.
*H01L 21/02*       (2006.01)
*C23C 16/02*       (2006.01)
(Continued)

(52) U.S. Cl.
CPC .... *H01L 21/02304* (2013.01); *C23C 16/0245* (2013.01); *C23C 16/04* (2013.01);
(Continued)

(58) Field of Classification Search
CPC ......... H01L 21/02271; H01L 21/02274; H01L 21/32; H01L 21/321; H01L 21/76832; H01L 21/76883; H01L 21/76897
(Continued)

(56) References Cited

U.S. PATENT DOCUMENTS 8,728,956 B2      5/2014  Lavoie et al.
9,355,839 B2      5/2016  Swaminathan et al.
(Continued)

FOREIGN PATENT DOCUMENTS

CN          105408244 A      3/2016
CN          105556644 A      5/2016
(Continued)

OTHER PUBLICATIONS

CN Office Action dated May 23, 2024 in CN Application No. 201980027453.4, with English Translation.
(Continued)

*Primary Examiner* — Fazli Erdem
(74) *Attorney, Agent, or Firm* — Weaver Austin Villeneuve & Sampson LLP

(57)          ABSTRACT

The present disclosure relates to methods and apparatuses for selective deposition on a surface. In particular, a silicon-containing inhibitor can be used to selectively bind to a first region, thus inhibiting deposition of a material on that first region.

20 Claims, 7 Drawing Sheets

(51) Int. Cl.

| | |
|---|---|
| *C23C 16/04* | (2006.01) |
| *C23C 16/34* | (2006.01) |
| *C23C 16/40* | (2006.01) |
| *C23C 16/455* | (2006.01) |
| *C23C 16/56* | (2006.01) |
| *H01J 37/32* | (2006.01) |

(52) U.S. Cl.
CPC .............. *C23C 16/34* (2013.01); *C23C 16/40* (2013.01); *C23C 16/45544* (2013.01); *C23C 16/56* (2013.01); *H01J 37/32834* (2013.01); *H01L 21/02211* (2013.01); *H01L 21/0228* (2013.01); *H01L 21/02315* (2013.01); *H01L 21/0234* (2013.01); *H01L 21/0214* (2013.01); *H01L 21/02164* (2013.01); *H01L 21/02178* (2013.01); *H01L 21/02181* (2013.01); *H01L 21/02186* (2013.01); *H01L 21/02189* (2013.01)

(58) Field of Classification Search
USPC ........................................................ 438/778
See application file for complete search history.

(56)                    References Cited

U.S. PATENT DOCUMENTS

| | | | |
|---|---|---|---|
| 10,038,079 | B1 | 7/2018 | Ohtou et al. |
| 10,043,656 | B1 | 8/2018 | Smith et al. |
| 10,662,526 | B2 | 5/2020 | Hausmann et al. |
| 11,404,275 | B2 | 8/2022 | Hausmann et al. |
| 2002/0155722 | A1 | 10/2002 | Satta et al. |
| 2002/0185225 | A1 | 12/2002 | Toshima et al. |
| 2004/0087176 | A1 | 5/2004 | Colburn et al. |
| 2010/0144146 | A1 | 6/2010 | Utaka et al. |
| 2011/0025673 | A1 | 2/2011 | Chen et al. |
| 2011/0256724 | A1 | 10/2011 | Chandrasekharan et al. |
| 2011/0256734 | A1 | 10/2011 | Hausmann et al. |
| 2012/0225553 | A1 | 9/2012 | Lazovsky et al. |
| 2015/0299848 | A1 | 10/2015 | Haukka et al. |
| 2015/0299858 | A1 | 10/2015 | Yudovsky et al. |
| 2016/0163538 | A1 | 6/2016 | Nakazumi et al. |
| 2016/0190060 | A1 | 6/2016 | Bristol et al. |
| 2017/0012001 | A1 | 1/2017 | Gordon et al. |
| 2017/0069527 | A1 | 3/2017 | Haukka et al. |
| 2017/0323781 | A1 | 11/2017 | Kachian et al. |
| 2017/0342553 | A1 | 11/2017 | Yu et al. |
| 2018/0012752 | A1 | 1/2018 | Tapily |
| 2018/0166379 | A1 | 6/2018 | Yeo et al. |
| 2018/0366317 | A1 | 12/2018 | Ke et al. |
| 2019/0157079 | A1 | 5/2019 | Ke et al. |
| 2019/0164758 | A1 | 5/2019 | Su et al. |
| 2020/0013615 | A1 | 1/2020 | Hausmann et al. |
| 2020/0234943 | A1* | 7/2020 | Bhuyan ............... H01L 21/0217 |
| 2021/0005460 | A1 | 1/2021 | Hausmann et al. |
| 2022/0319854 | A1 | 10/2022 | Hausmann et al. |

FOREIGN PATENT DOCUMENTS

| | | | |
|---|---|---|---|
| CN | 108028172 | A | 5/2018 |
| CN | 111108232 | A | 5/2020 |
| JP | 2019165256 | A | 9/2019 |
| KR | 100561493 | B1 | 3/2006 |
| KR | 1020080109218 | A | 12/2008 |
| KR | 20100126507 | A | 12/2010 |
| KR | 20170135760 | A | 12/2017 |
| KR | 20180006864 | A | 1/2018 |
| KR | 20180029934 | A | 3/2018 |
| KR | 20200108242 | A | 9/2020 |
| TW | I722301 | B | 3/2021 |
| WO | WO-2011141628 | A1 | 11/2011 |
| WO | WO-2018195423 | A1 | 10/2018 |

OTHER PUBLICATIONS

International Preliminary Report on Patentability dated Apr. 6, 2023 in Application No. PCT/US2021/051639.

KR Office Action dated Apr. 24, 2024 in KR Application No. 10-2020-7028316 with English translation.

KR Office Action dated Dec. 26, 2024 in KR Application No. 10-2020-7028316, with English Translation.

U.S. Advisory Action dated Nov. 2, 2023, in U.S. Appl. No. 17/808,046.

U.S. Final office Action dated Aug. 7, 2023 in U.S. Appl. No. 17/808,046.

U.S. Final Office Action dated Mar. 21, 2024 in U.S. Appl. No. 17/808,046.

U.S. Non-Final Office Action dated Aug. 9, 2024 in U.S. Appl. No. 17/808,046.

U.S. Non-Final Office Action dated Nov. 16, 2023 in U.S. Appl. No. 17/808,046.

A.J.M Mackus, et al., "Fully Self-Aligned Vias: The Killer Application for Area-Selective ALD?—A Discussion of Requirements for Implementation in High Volume Manufacturing" 2019, 7, Atomic Limits, pp. 1-6. url: https://www.atomiclimits.com retrieved Aug. 26, 2020.

International Preliminary Report on Patentability dated Sep. 17, 2020 issued in Application No. PCT/US2019/020408.

International Search Report and Written Opinion dated Jun. 17, 2019 issued in Application No. PCT/US2019/020408.

International Search Report and Written Opinion dated Jan. 7, 2022, in Application No. PCT/US2021/051639.

U.S. Non Final Office Action dated Mar. 16, 2023 in U.S. Appl. No. 17/808,046.

U.S. Non Final Office Action dated Nov. 15, 2021 in U.S. Appl. No. 16/977,438.

U.S. Notice of Allowance dated Mar. 22, 2022 in U.S. Appl. No. 16/977,438.

International Preliminary Report on Patentability and Written Opinion dated Sep. 26, 2024 in PCT Application No. PCT/US2023/014982.

International Search Report and Written Opinion dated Jul. 3, 2023, in Application No. PCT/US2023/014982.

TW Office Action and Search Report dated Jul. 21, 2025 in TW Application No. 110135524, with English Translation.

U.S. Final Office Action dated Feb. 5, 2025 in U.S. Appl. No. 17/808,046.

* cited by examiner

SELECTIVE DEPOSITION OF METAL OXIDES USING SILANES AS AN INHIBITOR

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes. This application claims the benefit of U.S. Provisional Patent Application No. 63/198, 060, filed Sep. 25, 2020, which is incorporated herein by reference in its entirety.

FIELD

The present disclosure relates to relates to methods and apparatuses for selective deposition on a surface. In particular, a silicon-containing inhibitor can be used to selectively bind to a first region, thus inhibiting deposition of a material on that first region.

BACKGROUND

As technology moving towards smaller and smaller nodes, patterning of small structures with extreme ultraviolet (EUV) lithography is getting increasingly difficult and it is becoming challenging to the land metal via on the metal lines in the back end of the line (BEOL). This leads to edge placement error (distance between the intended and actual position on the feature edge) and tiger tooth defects, which increase the RC delay and impact the device performance. The downscaling of the semiconductor devices is limited by the consequences of the edge placement errors.

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

SUMMARY

The present disclosure relates to use of a silicon-containing inhibitor to selectively inhibit a first region on a semiconductor surface and to selectively deposit a material on a second region that is not inhibited. In this way, selective inhibition and deposition can be implemented to provide controlled electrical connections and/or patterned dielectric layers.

In particular embodiments, the silicon-containing inhibitor can be used to form silicide bonds preferentially on certain surfaces, such as those having a metal or a semiconductor, thereby forming inhibited surfaces. The remaining non-inhibited surfaces can then be further treated or processed in a selective manner. For instance, although a material can be provided to the entire surface, deposition of that material will occur on the exposed, non-inhibited surface.

In one embodiment, to improve the RC performance, a metal surface is inhibited with a silicon-containing inhibitor, and deposition occurs on a non-inhibited, non-metal surface (e.g., a dielectric surface). In particular, deposition can include introduction of a selective metal oxide thin film, which can be deposited on an interlayer dielectric (ILD) to increase the distance between metal via and metal lines and reduce the contact. This additional topography created by selective deposition of a dielectric on a dielectric surface can create extra spacing between the fabricated via and neighboring metal line, which can improve the device performance and reduce the RC delay.

To enable selective deposition, in one non-limiting instance, a metal surface is inhibited by a silane, which acts as an inhibitor to block deposition on metal lines. A thin inhibitor layer (e.g., as a monolayer or a multilayer) is thermally deposited on a metal region of the substrate but not on a non-metal region in proximity to the metal region. This non-metal region can include a semiconductor or a dielectric. Then, a material is deposited on the substrate (or wafer). Due to the presence of the inhibitor layer, the material is deposited primarily on the non-metal region of the substrate. Deposition of the material can occur in a same or different processing chamber as that employed for providing the inhibitor layer. Optionally, the inhibitor layer can be removed after deposition of the material in any useful manner, such as by plasma treatment or other cleaning steps in the form of wet or dry etch processes. Similarly, rather than a metal surface, the silane can be used to inhibit a surface of a semiconductor material, as compared to a surface of a dielectric.

Accordingly, in a first aspect, the present disclosure encompasses a method for selective deposition including: providing a surface of a semiconductor substrate including a first region and a second region; introducing a silicon-containing inhibitor to the surface to provide an inhibitor layer on the first region; and depositing a first layer on at least a portion of a non-inhibited surface including the second region.

In some embodiments, the first region includes a metal or a semiconductor, and the second region includes a different material than the first region. Non-limiting metals include copper (Cu), cobalt (Co), tungsten (W), ruthenium (Ru), tantalum (Ta), titanium (Ti), hafnium (Hf), zirconium (Zr), and/or molybdenum (Mo), as well as mixtures thereof, doped forms thereof, and/or alloys thereof. Non-limiting semiconductors include silicon (Si), germanium (Ge), silicon germanium (SiGe), doped Si, or doped Ge.

In some embodiments, the first region includes a metal (e.g., any described herein), and the second region includes a dielectric or a semiconductor. In particular embodiments, the second region includes silicon (Si), silicon dioxide ($SiO_2$), doped $SiO_2$, silicon nitride, silicon carbide, silicon oxycarbide, silicon oxynitride, silicon carbon nitride, a low-K dielectric, germanium, silicon germanium, or germanium silicon.

In some embodiments, the first region includes the semiconductor (e.g., any described herein), and the second region includes a dielectric. In particular embodiments, the second region includes silicon dioxide ($SiO_2$), doped $SiO_2$, silicon nitride, silicon carbide, silicon oxycarbide, silicon oxynitride, silicon carbon nitride, or a low-K dielectric.

In some embodiments, said introducing includes a dose time of about 5 seconds to 600 seconds. In other embodiments, said introducing includes a temperature of about 50° C. to 100° C. and/or a pressure of about 5 Torr to 10 Torr. In particular embodiments, said introducing is conducted at a first temperature that is lower than a second temperature during said depositing.

In some embodiments, said depositing includes atomic layer deposition (ALD) or chemical vapor deposition (CVD), including plasma-enhanced forms thereof.

In some embodiments, the silicon-containing inhibitor includes a head group including at least one Si—H group and a tail group including an organic moiety. In particular embodiments, the head group includes —SiH$_3$.

In some embodiments, the first layer includes an oxide, a metal oxide, a nitride, a metal nitride, a carbide, a metal carbide, or an oxynitride. In other embodiments, the first layer includes aluminum oxide, zinc oxide, zirconium oxide, hafnium oxide, silicon oxide, silicon oxynitride, silicon nitride, or titanium oxide.

In some embodiments, the method further includes (e.g., before said introducing): pre-treating the surface with a plasma. In other embodiments, the method further includes (e.g., before said depositing): annealing the inhibitor layer at a temperature of from about 250° C. to 350° C.

In some embodiments, the method further includes (e.g., after said depositing): further depositing a second layer on at least a portion of a surface of the first layer or the non-inhibited surface. In other embodiments, the method further includes (e.g., after said depositing or after said further depositing): post-treating the surface to remove the inhibitor layer. In yet other embodiments, the method further includes (e.g., after said post-treating): providing a patterned via including a metal, wherein the patterned via is configured to be electrically connected to the first region.

In a second aspect, the present disclosure encompasses an apparatus for selective deposition. In one embodiment, the apparatus includes: a processing chamber; a substrate holder in the processing chamber; one or more gas inlets for flowing gases into the processing chamber; a vacuum source for removing gases from the processing chamber; a plasma generator for generating a plasma within the processing chamber; and one or more controllers including machine-readable instructions for operating the one or more gas inlets, vacuum source, and plasma generator to deposit onto a semiconductor substrate.

In one embodiment, the machine-readable instructions of the one or more controllers includes instructions for:

(a) optionally causing operation of the plasma generator to provide a plasma to pre-treat a surface of the semiconductor substrate.

(b) causing operation of the one or more gas inlets to flow a silicon-containing inhibitor into the processing chamber and provide an inhibitor layer on a first region of a semiconductor substrate held in the substrate holder, wherein the first region includes a metal or a semiconductor, wherein the semiconductor substrate further includes a second region including a different material than the first region, and wherein the silicon-containing inhibitor includes a head group including at least one Si—H group and a tail group including an organic moiety;

(c) causing operation of the vacuum source to remove at least some of the silicon-containing inhibitor from the processing chamber;

(d) optionally causing operation of the substrate holder to anneal the inhibitor layer at a temperature of from about 250° C. to 350° C.;

(e) causing operation of the one or more gas inlets to flow a first precursor to deposit a first layer on at least a portion of a non-inhibited surface including the second region;

(f) optionally causing operation of the one or more gas inlets to flow a second precursor to further deposit a second layer on at least a portion of a surface of the first layer or the non-inhibited surface; and (g) optionally causing operation of the plasma generator, after (e) or (f), to provide a plasma to post-treat a surface of the semiconductor substrate to remove the inhibitor layer.

In a third aspect, the present disclosure encompasses an apparatus for selective deposition. In one embodiment, the apparatus includes: a first processing chamber having a first substrate holder; a second processing chamber having a second substrate holder; a transfer module configured to transfer a semiconductor substrate from the first processing chamber to the second processing chamber; one or more gas inlets for flowing gases into the first and second processing chambers; a vacuum source for removing gases from the first and/or second processing chambers; a plasma generator for generating a plasma within the first and/or second processing chamber; and one or more controllers including machine-readable instructions for operating the one or more gas inlets, vacuum source, and plasma generator to deposit onto the semiconductor substrate.

In one embodiment, the machine-readable instructions of the one or more controllers includes instructions for:

(a) optionally causing operation of the plasma generator to provide a plasma to the first processing chamber to pre-treat a surface of the semiconductor substrate.

(b) causing operation of the one or more gas inlets to flow a silicon-containing inhibitor into the first processing chamber and provide an inhibitor layer on a first region of a semiconductor substrate held in the substrate holder, wherein the first region includes a metal or a semiconductor, wherein the semiconductor substrate further includes a second region including a different material than the first region, and wherein the silicon-containing inhibitor includes a head group including at least one Si—H group and a tail group including an organic moiety;

(c) causing operation of the vacuum source to remove at least some of the silicon-containing inhibitor from the first processing chamber;

(d) optionally causing operation of the first substrate holder to anneal the inhibitor layer at a temperature of from about 250° C. to 350° C.;

(e) causing operation of the transfer module to transfer the semiconductor substrate from the first processing chamber to the second processing chamber;

(f) optionally causing operation of the second substrate holder to anneal the inhibitor layer at a temperature of from about 250° C. to 350° C.;

(g) causing operation of the one or more gas inlets to flow a first precursor to the second processing chamber to deposit a first layer on at least a portion of a non-inhibited surface including the second region;

(h) optionally causing operation of the one or more gas inlets to flow a second precursor to the second processing chamber to further deposit a second layer on at least a portion of a surface of the first layer or the non-inhibited surface; and (i) optionally causing operation of the plasma generator, after (g) or (h), to provide a plasma to the second processing chamber to post-treat a surface of the semiconductor substrate to remove the inhibitor layer.

In any embodiment herein, the inhibitor layer includes a self-assembled monolayer or a self-assembled multilayer.

In any embodiment herein, the silicon-containing inhibitor includes RSiHX$^1$X$^2$; R is the organic moiety; and each of X$^1$ and X$^2$ is, independently, selected from the group consisting of hydrogen (H), halo, optionally substituted aliphatic, optionally substituted cycloaliphatic, or optionally substituted aromatic. In some embodiments, each $X^1$ and $X^2$ is, independently, optionally substituted alkyl, optionally substituted alkenyl, optionally substituted alkynyl, optionally substituted cycloalkyl, or optionally substituted aryl. In other embodiments, In any embodiment herein, the organic moiety is or includes optionally substituted aliphatic, optionally substituted heteroaliphatic, optionally substituted cycloaliphatic, optionally substituted cycloheteroaliphatic, or optionally substituted aromatic. In some embodiments, the organic moiety is or includes optionally substituted alkyl, optionally substituted alkenyl, optionally substituted alkynyl, optionally substituted heteroalkyl, optionally substituted heteroalkenyl, optionally substituted heteroalkynyl, optionally substituted cycloalkyl, optionally substituted cycloheteroalkyl, optionally substituted aryl, or optionally substituted heterocyclyl. In other embodiments, the organic moiety is or includes a branched-chain hydrocarbon and/or includes one or more halo substitutions. In yet other embodiments, the organic moiety is or includes —X-L-Z, wherein X, L, and Z are any described herein. In some embodiments, the organic moiety includes 6 to 20 carbon atoms within a linear chain, branched chain, or cyclic group. Additional embodiments are described herein.

DETAILED DESCRIPTION

The present disclosure relates to use of a silicon-containing inhibitor to selectively inhibit particular regions on a semiconductor substrate. In one embodiment, the substrate can include a first region (e.g., including a metal or a semiconductor) and a second region (e.g., including a material that is different than the first region). For instance, when the first region includes a metal, then the second region can include a semiconductor or a dielectric. In another instance, when the first region includes a semiconductor, then the second region can include a dielectric.

The processes herein can provide an inhibitor layer to selectively deposit on the first region, thereby providing an inhibited surface. In this way, the inhibited surface is blocked from subsequent deposition steps, which can provide a deposited layer on the non-inhibited surface of the second region. Just as the first region is selectively inhibited, the second region is selectively deposited with a layer (e.g., an oxide layer, a nitride layer, a carbide layer, or others described herein). Subsequent steps can include opening up the first region (e.g., by removing the inhibitor layer), patterning the substrate to provide access to only the first region, and depositing a metal within the pattern to provide a patterned via that is electrically connected to the first region. If the first region includes a metal line, then the patterned via can provide an electrical contact to that line.

Without wishing to be limited by mechanism, use of a silicon-containing inhibitor (or silane) for a selective deposition process has certain advantages over other purposed methods, as the silicon-containing inhibitor layer does not damage the surface onto which it deposits. Silane provides an additional advantage in terms of ease of deposition and removal, along with associated low cost. These factors can be advantageous because damaging metal could increase the resistance of that metal line or via. This, in turn, could slow down electronic device switching speeds. Furthermore, at sufficiently high temperatures, silanes can react with a metal or metalloid surface to form silicide bonds. Such bonds can provide a more stable layer, as compared to an inhibitor attached by way of van der Waals or other weak forces. In turn, this stability can provide an inhibitor layer that resists desorption during deposition, reduces nucleation of a material on the inhibited surface, and enhance selectivity.

In other non-limiting embodiments, the selective deposition processes herein can reduce the RC delay and improve device performance. In further embodiments, the processes herein can reduce EUV lithography steps, as well as save time and potentially cost.

Figure 1:
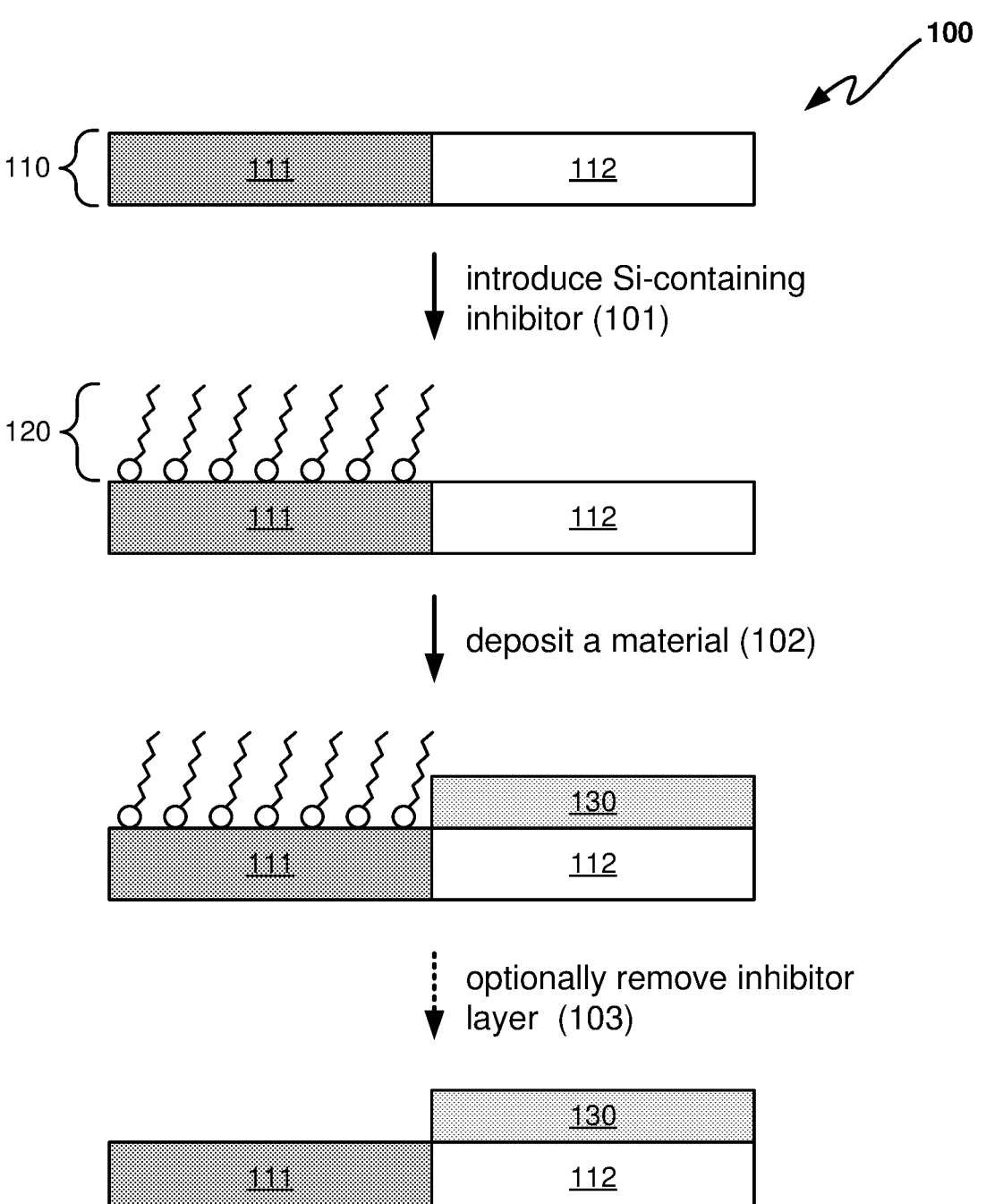
FIG. 1 provides a schematic of non-limiting operations for selective deposition.

FIG. 1 schematically shows a non-limiting process 100 for selective deposition. As can be seen, the substrate 110 includes a first region 111 and a second region 112 that is different from the first region 111 and in proximity to the first region 111. In one embodiment, the first region 111 includes a conductive material (e.g., a metal), and the second region 112 includes a semi- or non-conductive material (e.g., a semiconductor or a dielectric). In another embodiment, the first region 111 includes a semi-conductive material, and the second region 112 includes a non-conductive material.

Non-limiting conductive materials can include a metal, such as a transition metal, including cobalt (Co), copper (Cu), tungsten (W), ruthenium (Ru), tantalum (Ta), titanium (Ti), hafnium (Hf), zirconium (Zr), and/or molybdenum (Mo), as well as combinations thereof and doped forms thereof. Non-limiting semi-conductive materials include silicon (Si), germanium (Ge), silicon germanium (SiGe), germanium silicon (GeSi), doped Si, doped Ge, and, in some instances, silicon carbide. Non-limiting non-conductive materials can include a non-metal or a dielectric, such as a low-κ dielectric. Examples of low-κ dielectrics include those having a relative dielectric constant (κ) of less than about 4.0 or less than about 3.0, as well as from about 2.0 to 4.0, 2.0 to 2.0, 2.5 to 4.0, or 2.5 to 3.0. Low-K dielectrics include silicon dioxide ($SiO_2$), including doped $SiO_2$ (e.g., carbon-doped oxide (CDO) or carbon-doped $SiO_2$), porous $SiO_2$, porous doped $SiO_2$ (e.g., porous CDO), silicon nitride, silicon carbide in some instances, silicon oxycarbide, silicon oxynitride, silicon carbon nitride, etc.

Turning again to FIG. 1, the process 100 can include introducing 101 a silicon-containing inhibitor, depositing 102 a material, and optionally removing 103 the inhibitor layer. Each of these operations are discussed in turn. In operation 101, the silicon-containing inhibitor is introduced to the surface of the substrate 110. Due to the affinity of the inhibitor molecule to the first region 111, an inhibitor layer 120 is selectively provided on the first region 111. Most of the second region 112 is free from the silicon-containing inhibitor, thus providing a non-inhibited surface.

The inhibitor layer 120 can be characterized by its position, e.g., being disposed by its proximity to the first region as compared to the second region. The inhibitor layer can also be characterized by the orientation of the silicon-containing inhibitor. As seen in FIG. 1, the silicon-containing inhibitor is characterized by a head group (circle) and a tail group (line), in which the head group is in proximity to the surface of the first region 111. Not every inhibitor molecule needs to be oriented in such a fashion, and the inhibitor layer can include an ordered layer with precise head group orientation to the surface of the first region or a disordered layer with some but not all head groups oriented in the same direction.

Furthermore, the inhibitor layer can be a monolayer (a single layer of the molecules, including an ordered or disordered monolayer) or a multilayer (more than one layer of the molecule, including ordered or disordered bilayer or other multilayers). Within a multilayer, each layer be oriented in any useful manner, such as a first layer with head groups primarily oriented towards the surface of the first region, and a second layer disposed above the second layer with its tail groups oriented towards the tail groups of the first layer. Such multilayer can have any useful configuration of layers and silicon-containing inhibitors that can be envisaged to minimize energetic interactions during a self-assembly process.

Properties of the inhibitor layer can be characterized by its mass change, which can indicate the number of intact or cleaved inhibitor molecules; its water contact angle (WCA), which can indicate the density or packing of the layer(s); and/or its C—H bending or stretching modes using FTIR, can indicate the density or packing of the layer(s). In one embodiment, the inhibitor layer is characterized by a WCA of more than about 100° C. or from about 100° C. to 120° C.

The silicon-containing inhibitor (e.g., any described herein) can be introduced to the surface with useful process conditions. In one embodiment, the silicon-containing inhibitor is provided to the chamber with a dose time of about 5 seconds to 600 seconds and/or at a temperature of about 50° C. to 400° C. or 50° C. to 100° C. and/or a pressure of about 5 Torr to 10 Torr. In particular embodiments, the silicon-containing inhibitor is provided with an inert carrier gas (e.g., nitrogen $(N_2)$ gas). Si containing inhibitor is heated between 50-100 C. Carrier gas is $N_2$ and process pressure range is 5-10 Torr. Delivery of the inhibitor to the chamber can be continuous or in pulses. Additional process conditions are described herein.

As seen in FIG. 1, operation 102 includes depositing a material 130 on the second region 112. In one embodiment, the material 130 is provided as a layer. As used herein, selective deposition can mean selectively depositing a silicon-containing inhibitor on a first region and/or selectively depositing a material on a second region. The material 130 is selectively deposited on the second region 112 because the inhibitor layer 111 blocks deposition.

The material can be deposited using a vapor-based deposition process, such as ALD, CVD, as well as plasma-enhanced forms thereof. Non-limiting materials include non-conductive material, such as an insulator, as well as an oxide, a metal oxide, a nitride, a metal nitride, a carbide, a metal carbide, or an oxynitride. Examples of materials include aluminum oxide, zinc oxide, zirconium oxide, hafnium oxide, silicon oxide, silicon oxynitride, silicon nitride, or titanium oxide. Layers of material can be deposited using a plurality of cycles (e.g., 10, 100, 200, or more cycles). Other conditions can include a deposition time of about 5 seconds to 600 seconds and/or at a temperature of about 25° C. to 500° C. and/or a pressure of about 10 mTorr to 10 Torr.

Turning again to FIG. 1, operation 103 is optional and can include removing the inhibitor layer from the first region 111. In this way, the substrate can be further processed to provide a connection that is physically or electrically connected to the first region. For instance, if the first region 111 is a metal line, then removing the inhibitor layer 120 can allow for depositing a metal via that is electrically connected to the metal line and electrically insulated from contact with other metal lines within the substrate by the presence of the selectively deposited material 130.

Figure 2:
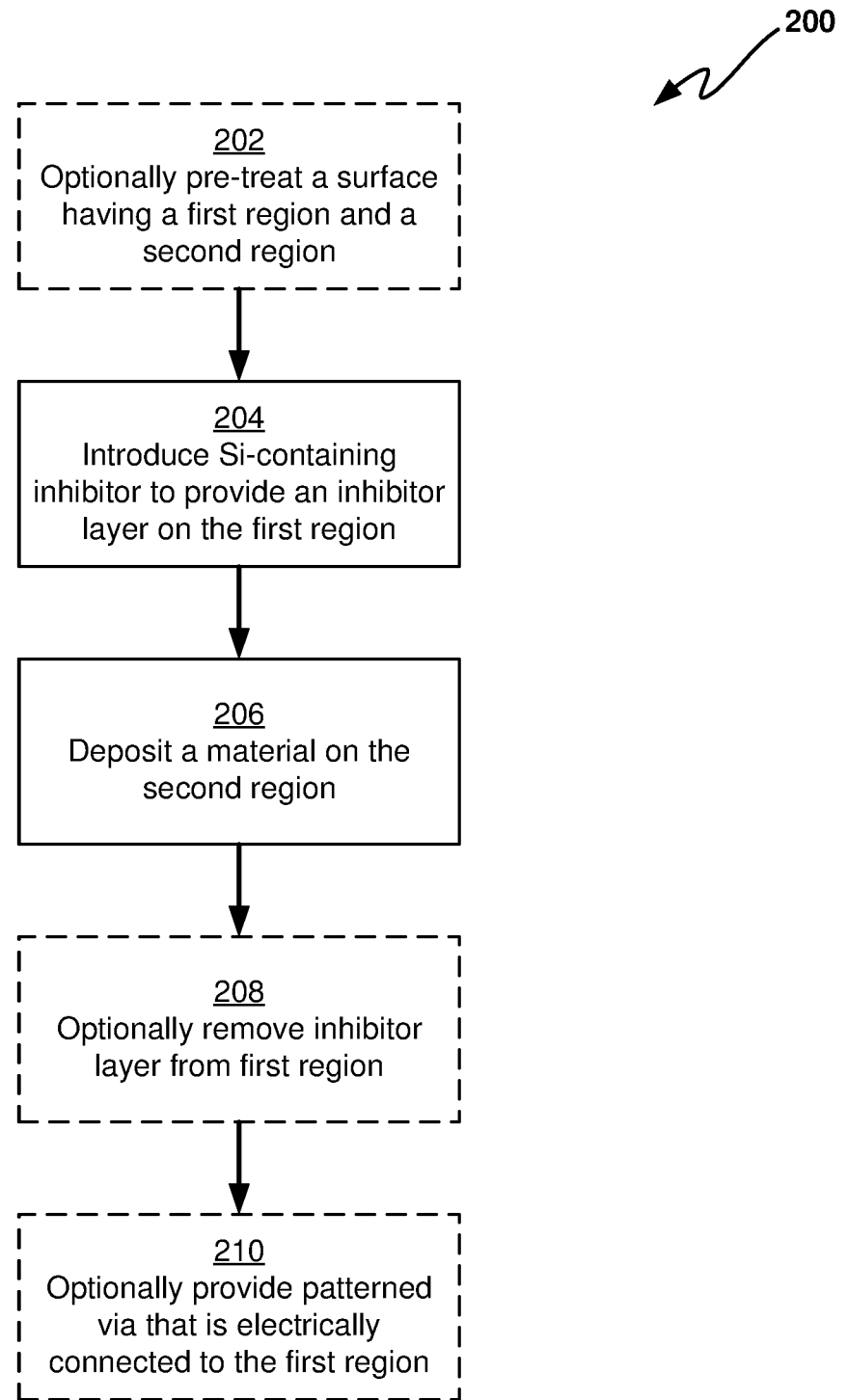
FIG. 2 provides a process flow diagram showing relevant operations of methods for selective deposition according to various embodiments.

FIG. 2 shows a process flow diagram for a selective deposition method 200. As can be seen, the method 200 includes operation 204 to introduce a silicon-containing inhibitor to provide an inhibitor layer on a first region of a substrate and operation 206 to deposit a material on a second region of a substrate. Operations 204, 206 can provide selective deposition, in which the silicon-containing inhibitor is selectively deposited on the first region and is relatively absent on the second region, and in which the material is selectively deposited on the second region and is relatively absent on the first region.

The method 200 can include optional operations. Operation 202 includes optionally pre-treating the surface of the semiconductor substrate having the first and second regions. In some embodiments, pre-treating provides an activated surface that promotes selective deposition of the silicon-containing inhibitor on the first region. Non-limiting pre-treatment processes include plasma treatment, reducing plasma treatment, or other reducing processes that remove metal oxide or other surface chemistry from the first region. Plasma treatment can include inductively coupled plasma (ICP) or capacitively coupled plasma (CCP). In one embodiment, treatment includes use of hydrogen $(H_2)$ gas for a treatment time of about 1 to 10 minutes. In another embodiment, treatment includes an ICP plasma source with the plasma gas being hydrogen $(H_2)$ gas and oxygen $(O_2)$ gas (e.g., at a power of about 100 W). Non-limiting conditions include a treatment time of about 30 seconds to 360 seconds and/or a substrate temperature of about 20° C. In yet another embodiment, treatment includes a CCP plasma source with the plasma gas being ammonia $(NH_3)$ gas (e.g., at a power of about 100 W). Non-limiting conditions include a treatment time of about 10 seconds to 60 seconds and/or a substrate temperature of about 200° C. to 300° C.

The inhibitor layer can be further treated, e.g., annealed at a temperature of from about 250° C. to 350° C. and, optionally, for a period of about 10 seconds to 360 seconds. Without wishing to be limited by mechanism, such an annealing step can provide an ordered layer, which may be beneficial for selective deposition of the metal oxide on the second region.

After depositing the metal oxide, further layers can be disposed on at least a portion of a surface of the metal oxide. Such further layers can serve as an etch stop layer, a diffusion barrier layer, a capping layer, a liner layer, etc. Non-limiting further layers can include a dielectric (e.g., any described herein), tantalum (Ta), or tantalum nitride $(Ta_xN_y)$.

Operation 208 includes optionally post-treating the surface to remove the inhibitor layer from the first region. Such post-treatment can include plasma treatment, wet etchant chemistry, dry etchant chemistry, or combinations thereof. Such post-treatment processes can include those that minimize damage to the first region. In another embodiment, treatment includes an ICP or CCP plasma source with the plasma gas being hydrogen $(H_2)$ gas or ammonia $(NH_3)$ gas.

Non-limiting conditions include a treatment time of about 30 seconds to 360 seconds and/or a substrate temperature of about 100° C. to 300° C.

Operation 210 includes optionally providing a patterned via that is electrically connected to the first region. Such a via can be provided by using a patterned mask and depositing a metal within open features within the mask to provide a metal connection that is electrically connected to the first region.

Figure 3:
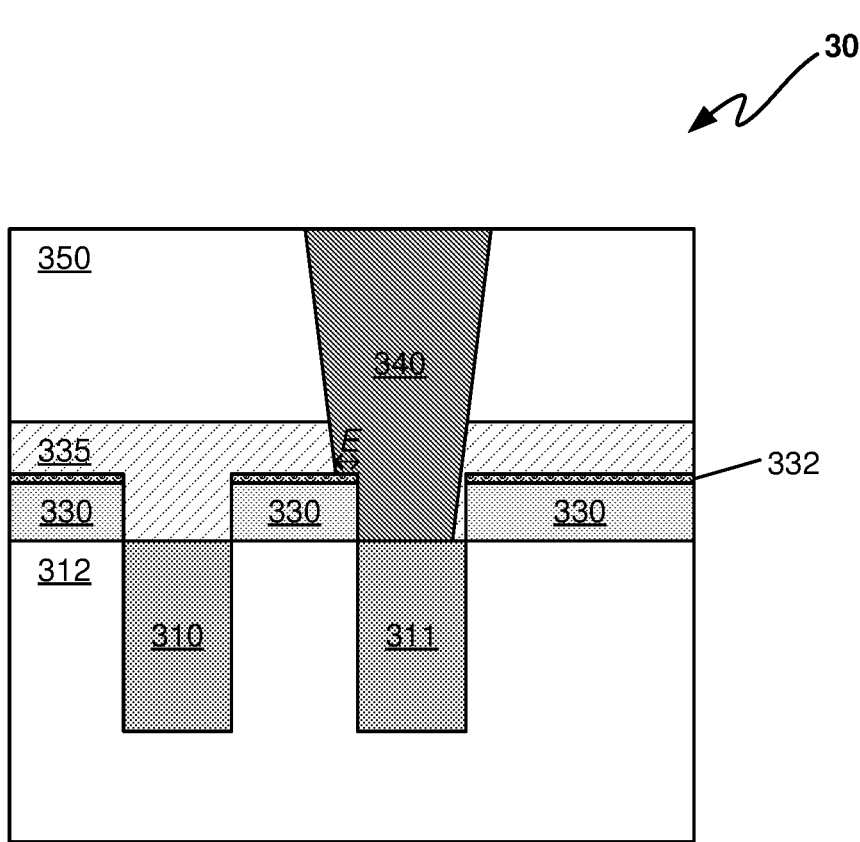
FIG. 3 provides a schematic of a non-limiting stack.

FIG. 3 provides an exemplary stack 300 formed by using the processes described herein. As can be seen, the stack 300 includes a substrate having metal lines 310, 311 surrounded by a dielectric 312. With the processes herein, the metal lines 310, 311 can serve as the first region upon which an inhibitor layer can be deposited; and the dielectric 312 can serve as the second region upon which a metal oxide 330 can be deposited. Optionally, a further layer 332 can be deposited on at least a portion of the surface of the metal oxide. Further patterning can provide a metal via 340 that is electrically connected to one metal line 311, a capping layer 335, and a further dielectric layer 350. The distance between the intended and actual position on the feature edge of the metal via 340 can be characterized by an edge placement error, as indicated in FIG. 3 by E.

Processing conditions can be optimized based on the composition and chemical characteristics of the silicon-containing inhibitor and the deposited metal oxide. For instance, deposition of the silicon-containing inhibitor can be characterized by mass change and/or a water contact angle (WCA) at various pedestal temperatures (e.g., from 120° C. to 300° C.) or pressure (e.g., from 5 to 10 Torr). In particular embodiments, a WCA of about 100° or more can be obtained. Other studies can include chemical characterization of the inhibitor layer, such as by Fourier-transform infrared spectroscopy (FTIR), transmission electron microscopy (TEM), cross-sectional transmission electron microscopy (XTEM), and/or energy-dispersive X-ray spectroscopy (EDS).

Figure 4A:
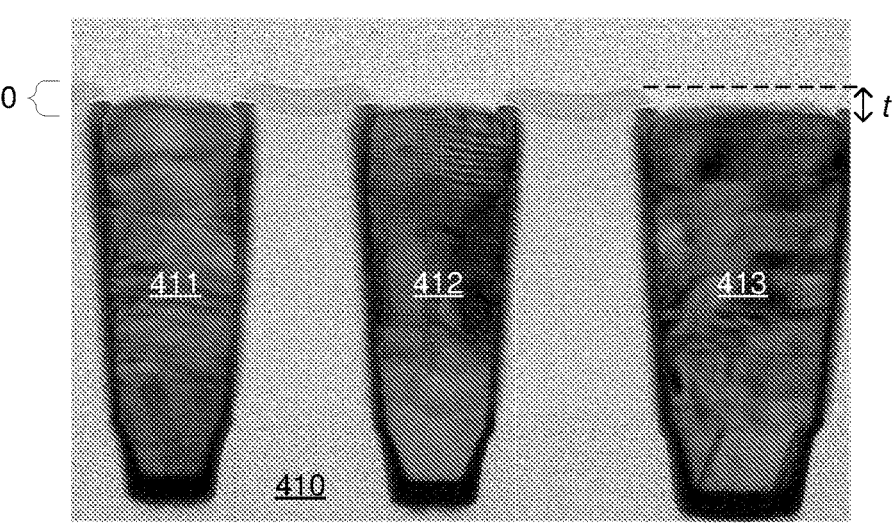
FIG. 4A-4C shows cross-sectional transmission electron microscopy (XTEM) images of selective deposition of aluminum oxide 420 having a thickness t on a surface of a non-metal material 410.
Figure 4B:
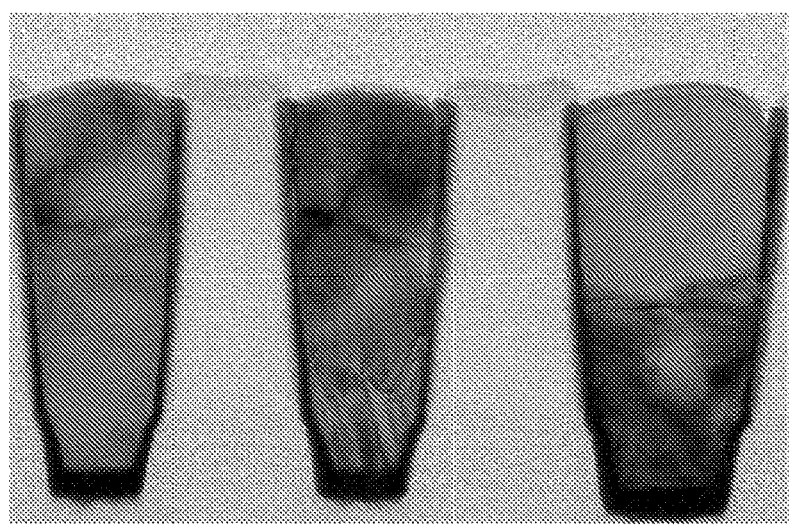
Figure 4C:
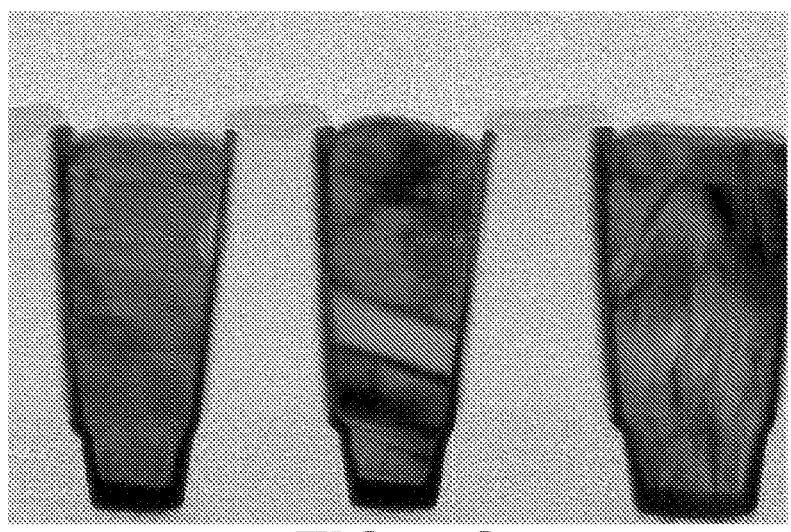

FIG. 4A-4C provides XTEM images, which shows selective inhibition of metal surfaces of regions 411, 412, and 413, as well as selective deposition of aluminum oxide 420 on non-metal surfaces of a substrate material 410. The inhibitor can be deposited at a temperature of about 100° C. to 400° C., a pressure of about 1 to 10 Torr, a flow range of about 1 to 10 slm, and with an inert carrier gas (e.g., $N_2$).

Silicon-Containing Inhibitors

Silicon-containing inhibitors can include any that include at least one Si atom and at least one organic moiety. In one embodiment, the silicon-containing inhibitor includes at least one Si—H bond or group. In another embodiment, the silicon-containing inhibitor includes at least three Si—H bonds and an organic moiety, i.e., $RSiH_3$, in which R is an organic moiety.

In one embodiment, the silicon-containing inhibitor includes a head group including one Si atom and a tail group including one organic moiety. In another embodiment, the head group is or includes —$SiH_3$ or —$SiH_2X^1$ or —$SiHX^1X^2$, in which each of $X^1$ and $X^2$ is, independently, selected from the group consisting of hydrogen (H), halo, optionally substituted aliphatic, optionally substituted cycloaliphatic, or optionally substituted aromatic. In particular embodiment, each of $X^1$ and $X^2$ is, independently, hydrogen (H), fluoro (F), chloro (Cl), bromo (Br), or iodo (I). In other embodiments, each of $X^1$ and $X^2$ is, independently, H, halo, or optionally substituted $C_{1-6}$ alkyl.

In other embodiments, the silicon-containing inhibitor is or includes $RSiHX^1X^2$, in which R is the organic moiety, and each of $X^1$ and $X^2$ is any described herein. In particular embodiment, each of $X^1$ and $X^2$ is, independently, H, F, Cl, Br, or I. In other embodiments, each of $X^1$ and $X^2$ is, independently, H, halo, or optionally substituted $C_{1-6}$ alkyl.

Non-limiting organic moiety (or R) can be or include optionally substituted aliphatic, optionally substituted heteroaliphatic, optionally substituted cycloaliphatic, optionally substituted cycloheteroaliphatic, or optionally substituted aromatic. In other embodiments, the organic moiety can be or include optionally substituted alkyl, optionally substituted alkenyl, optionally substituted alkynyl, optionally substituted heteroalkyl, optionally substituted heteroalkenyl, optionally substituted heteroalkynyl, optionally substituted cycloalkyl, optionally substituted cycloheteroalkyl, optionally substituted aryl, or optionally substituted heterocyclyl. Examples of substitutions for an organic moiety can include any described herein for alkyl or aryl. In particular embodiments, the organic moiety includes a branched-chain hydrocarbon. In other embodiments, the organic moiety includes an optionally substituted alkyl having one or more halo substitutions (e.g., one or more fluorine substitutions).

In other embodiments, the organic moiety is or includes —X-L-Z, and wherein:

X is a covalent bond, optionally substituted alkylene, optionally substituted alkenylene, optionally substituted alkynylene, optionally substituted alkyleneoxy, optionally substituted heteroalkylene, optionally substituted heteroalkenylene, optionally substituted heteroalkynylene, optionally substituted arylene, optionally substituted aryleneoxy, or optionally substituted heterocyclyldiyl;

L is a covalent bond, —$CR^1R^2$—, —$CR^1$=$CR^2$—, —$NR^1$—, —$C(O)$—, —$C(O)NR^1$—, —$NR^1C(O)$—, —$C(O)O$—, —$OC(O)$—, —$S$—, or —$O$—;

Z is H, optionally substituted alkyl, optionally substituted alkenyl, optionally substituted alkynyl, optionally substituted heteroalkyl, optionally substituted heteroalkenyl, optionally substituted heteroalkynyl, optionally substituted aryl, or optionally substituted heterocyclyl; and each of $R^1$ and $R^2$ is, independently, H or optionally substituted alkyl.

In some embodiments, X is optionally substituted alkylene; L is a covalent bond, —$CR^1R^2$—, —$CR^1$=$CR^2$—, —$NR^1$—, —$C(O)$—, —$C(O)NR^1$—, —$NR^1C(O)$—, —$C(O)O$—, —$OC(O)$—, —$S$—, or —$O$—; Z is H or optionally substituted alkyl; and each of $R^1$ and $R^2$ is, independently, H or optionally substituted $C_{1-6}$ alkyl.

In particular embodiments, the organic moiety includes 6 to 26 carbon atoms (e.g., 6 to 24, 6 to 20, 6 to 18, 8 to 26, 8 to 24, 8 to 20, 8 to 18, 10 to 26, 10 to 24, 10 to 20, or 10 to 18 carbon atoms) within a linear chain, branched chain, or cyclic group. Optionally, the organic moiety can be or include optionally substituted $C_{6-26}$ alkyl, optionally substituted $C_{6-26}$ alkenyl, optionally substituted $C_{6-26}$ alkynyl, optionally substituted $C_{6-26}$ heteroalkyl, optionally substituted $C_{6-26}$ heteroalkenyl, optionally substituted $C_{6-26}$ heteroalkynyl, optionally substituted $C_{6-26}$ cycloalkyl, optionally substituted $C_{6-26}$ cycloheteroalkyl, optionally substituted $C_{6-26}$ aryl, or optionally substituted $C_{6-26}$ heterocyclyl.

Non-limiting silicon-containing inhibitors include n-octadecylsilane ($C_{18}H_{40}Si$), tridecylsilane ($C_{13}H_{30}Si$), dodecylsilane ($C_{12}H_{28}Si$), undecylsilane ($C_{11}H_{26}Si$), decylsilane ($C_{10}H_{24}Si$), decan-4-ylsilane ($C_{10}H_{24}Si$), nonylsilane ($C_9H_{22}Si$), nonan-4-ylsilane ($C_9H_{22}Si$), octan-2-ylsilane $(C_8H_{20}Si)$, octylsilane $(C_8H_{20}Si)$, heptylsilane $(C_7H_{18}Si)$, heptan-4-ylsilane $(C_7H_{18}Si)$, (tridecafluoro-1,1,2,2-tetra-hydrooctyl)silane $(C_8H_7F_{13}Si)$, 10-undecenylsilane $(C_{11}H_{24}Si)$, and others.

Apparatuses

Figure 5:
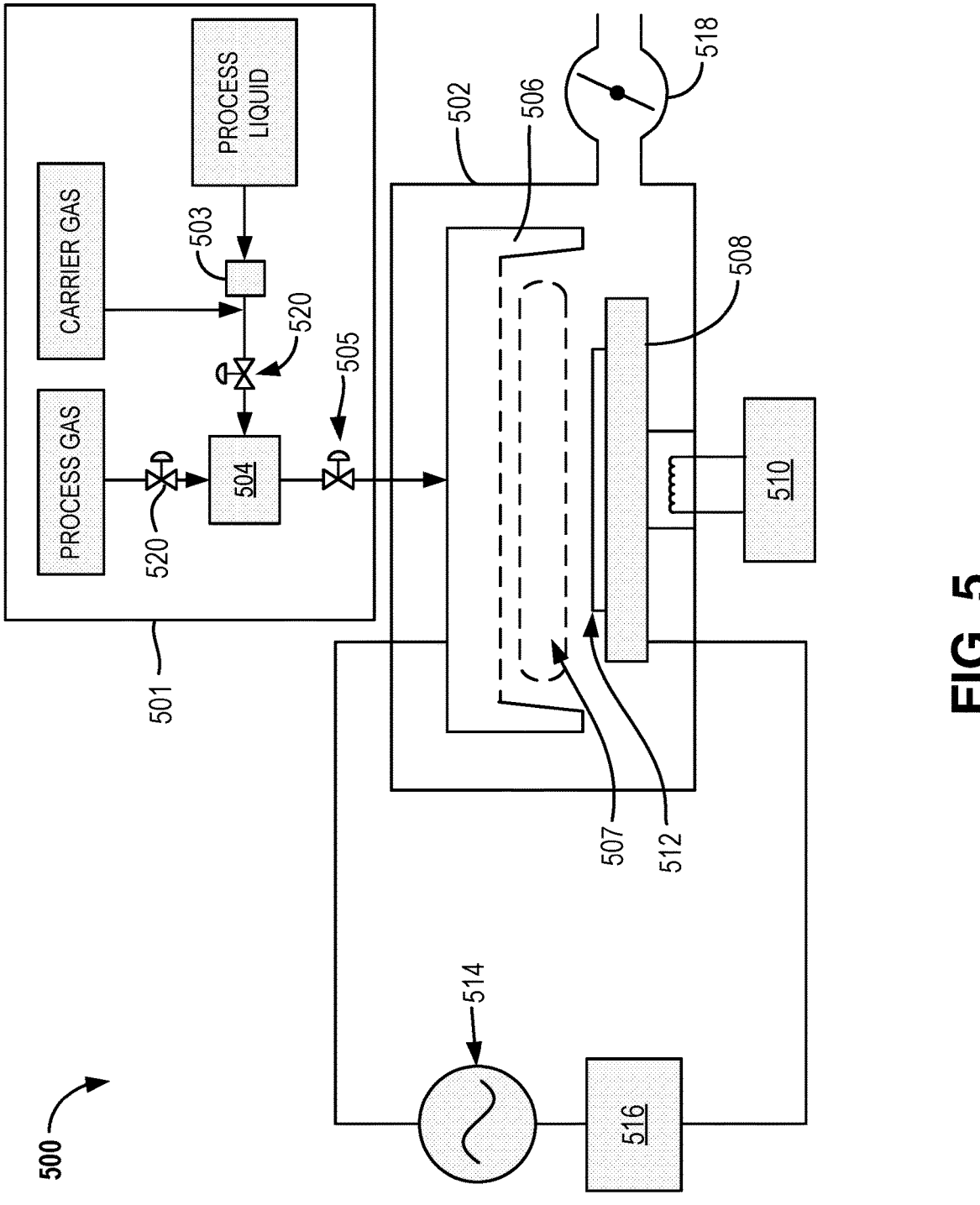
FIG. 5 shows a schematic illustration of an atomic layer deposition (ALD) or chemical vapor deposition (CVD) chamber suitable for practicing various embodiments.

FIG. 5 schematically shows an embodiment of a process station 500 that may be used to deposit material using atomic layer deposition (ALD) and/or chemical vapor deposition (CVD), either of which may be plasma enhanced. For simplicity, the process station 500 is depicted as a standalone process station having a process chamber body 502 for maintaining a low-pressure environment. However, it will be appreciated that a plurality of process stations 500 may be included in a common process tool environment. Further, it will be appreciated that, in some embodiments, one or more hardware parameters of process station 500, including those discussed in detail below, may be adjusted programmatically by one or more computer controllers.

Process station 500 fluidly communicates with reactant delivery system 501 for delivering process gases to a distribution showerhead 506. Reactant delivery system 501 includes a mixing vessel 504 for blending and/or conditioning process gases for delivery to showerhead 506. One or more mixing vessel inlet valves 520 may control introduction of process gases to mixing vessel 504. Similarly, a showerhead inlet valve 505 may control introduction of process gasses to the showerhead 506.

Some reactants, like BTBAS, may be stored in liquid form prior to vaporization at and subsequent delivery to the process station. For example, the embodiment of FIG. 5 includes a vaporization point 503 for vaporizing liquid reactant to be supplied to mixing vessel 504. In some embodiments, vaporization point 503 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100° C. to approximately 150° C. at mixing vessel 504.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller upstream of vaporization point 503 may be provided for controlling a mass flow of liquid for vaporization and delivery to process station 500. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 506 distributes process gases toward substrate 512. In the embodiment shown in FIG. 5, substrate 512 is located beneath showerhead 506, and is shown resting on a pedestal 508. It will be appreciated that showerhead 506 may have any suitable shape, and may have any suitable number and arrangement of ports for distributing processes gases to substrate 512.

In some embodiments, a microvolume 507 is located beneath showerhead 506. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 508 may be raised or lowered to expose substrate 512 to microvolume 507 and/or to vary a volume of microvolume 507. For example, in a substrate transfer phase, pedestal 508 may be lowered to allow substrate 512 to be loaded onto pedestal 508. During a deposition process phase, pedestal 508 may be raised to position substrate 512 within microvolume 507. In some embodiments, microvolume 507 may completely enclose substrate 512 as well as a portion of pedestal 508 to create a region of high flow impedance during a deposition process.

Optionally, pedestal 508 may be lowered and/or raised during portions the deposition process to modulate process pressure, reactant concentration, etc., within microvolume 507. In one scenario where process chamber body 502 remains at a base pressure during the deposition process, lowering pedestal 508 may allow microvolume 507 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 508 may allow a plasma density to be varied during plasma activation and/or treatment cycles included in the deposition process. At the conclusion of the deposition process phase, pedestal 508 may be lowered during another substrate transfer phase to allow removal of substrate 512 from pedestal 508.

While the example microvolume variations described herein refer to a height-adjustable pedestal, it will be appreciated that, in some embodiments, a position of showerhead 506 may be adjusted relative to pedestal 508 to vary a volume of microvolume 507. Further, it will be appreciated that a vertical position of pedestal 508 and/or showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers.

Returning to the embodiment shown in FIG. 5, showerhead 506 and pedestal 508 electrically communicate with RF power supply 514 and matching network 516 for powering a plasma. In some embodiments, the plasma energy may be controlled by controlling one or more of a process station pressure, a gas concentration, an RF source power, an RF source frequency, and a plasma power pulse timing. For example, RF power supply 514 and matching network 516 may be operated at any suitable power to form a plasma having a desired composition of radical species. Examples of suitable powers are included above. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 508 may be temperature controlled via heater 510. Further, in some embodiments, pressure control for deposition process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to process station 500.

Figure 6:
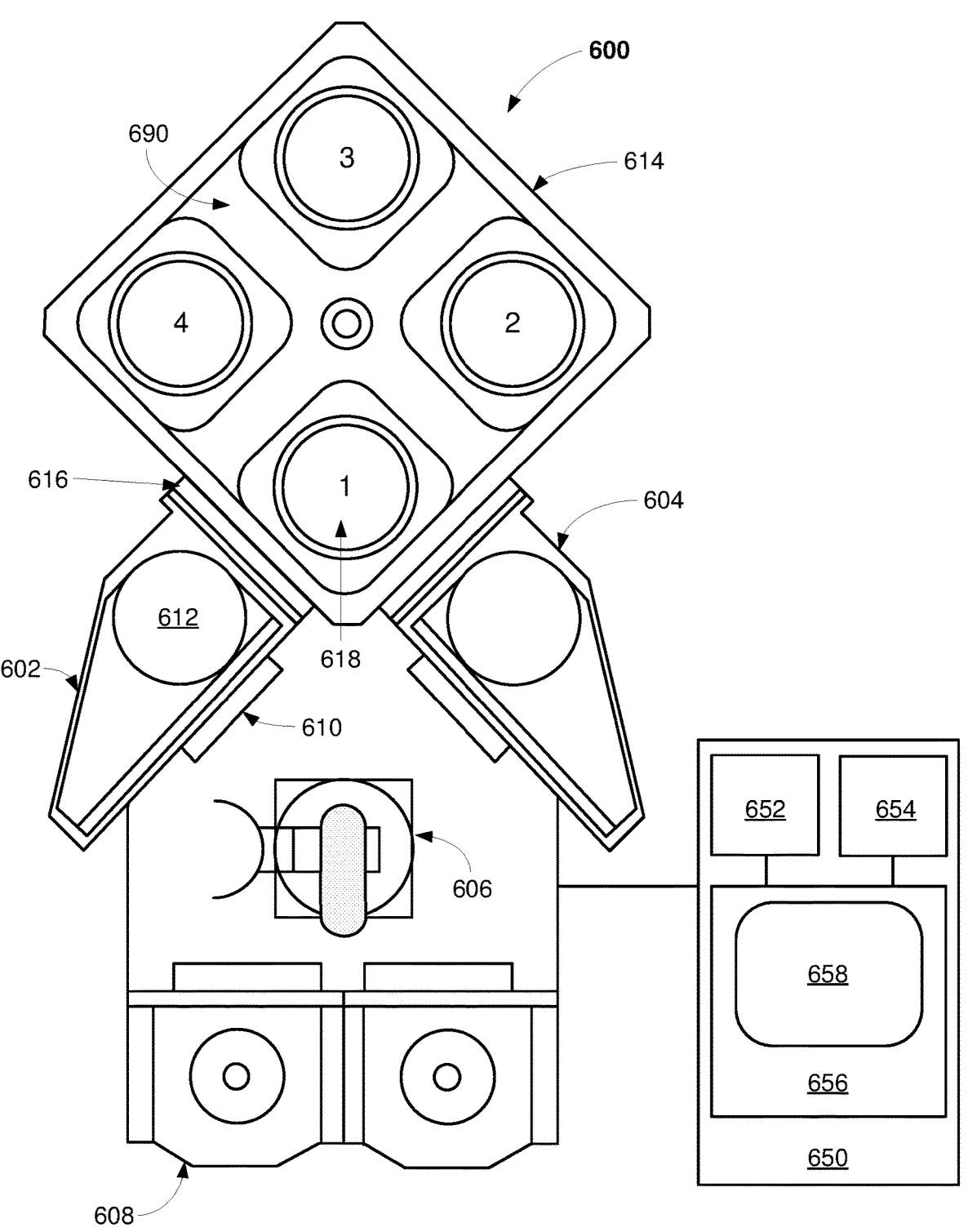
FIG. 6 shows another schematic illustration of another ALD or CVD chamber suitable for practicing various embodiments.

FIG. 6 shows a schematic view of an embodiment of a multi-station processing tool 600 with an inbound load lock 602 and an outbound load lock 604, either or both of which may comprise a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 comprises a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted in FIG. 6 includes load locks, it will be appreciated that, in some embodiments, direct entry of a wafer into a process station may be provided.

The depicted processing chamber 614 comprises four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. While the depicted processing chamber 614 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a wafer handling system 690 for transferring wafers within processing chamber 614. In some embodiments, wafer handling system 690 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some embodiments, system controller 650 controls all of the activities of process tool 600. System controller 650 executes system control software 658 stored in mass storage device 654, loaded into memory device 656, and executed on processor 652. System control software 658 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes in accordance with the disclosed methods. System control software 658 may be coded in any suitable computer readable programming language.

In some embodiments, system control software 658 may include input/output control (IOC) sequencing instructions for controlling the various parameters described above. For example, each phase of a plasma-enhanced ALD (PEALD) process may include one or more instructions for execution by system controller 650. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase.

Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges.

A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Figure 7:
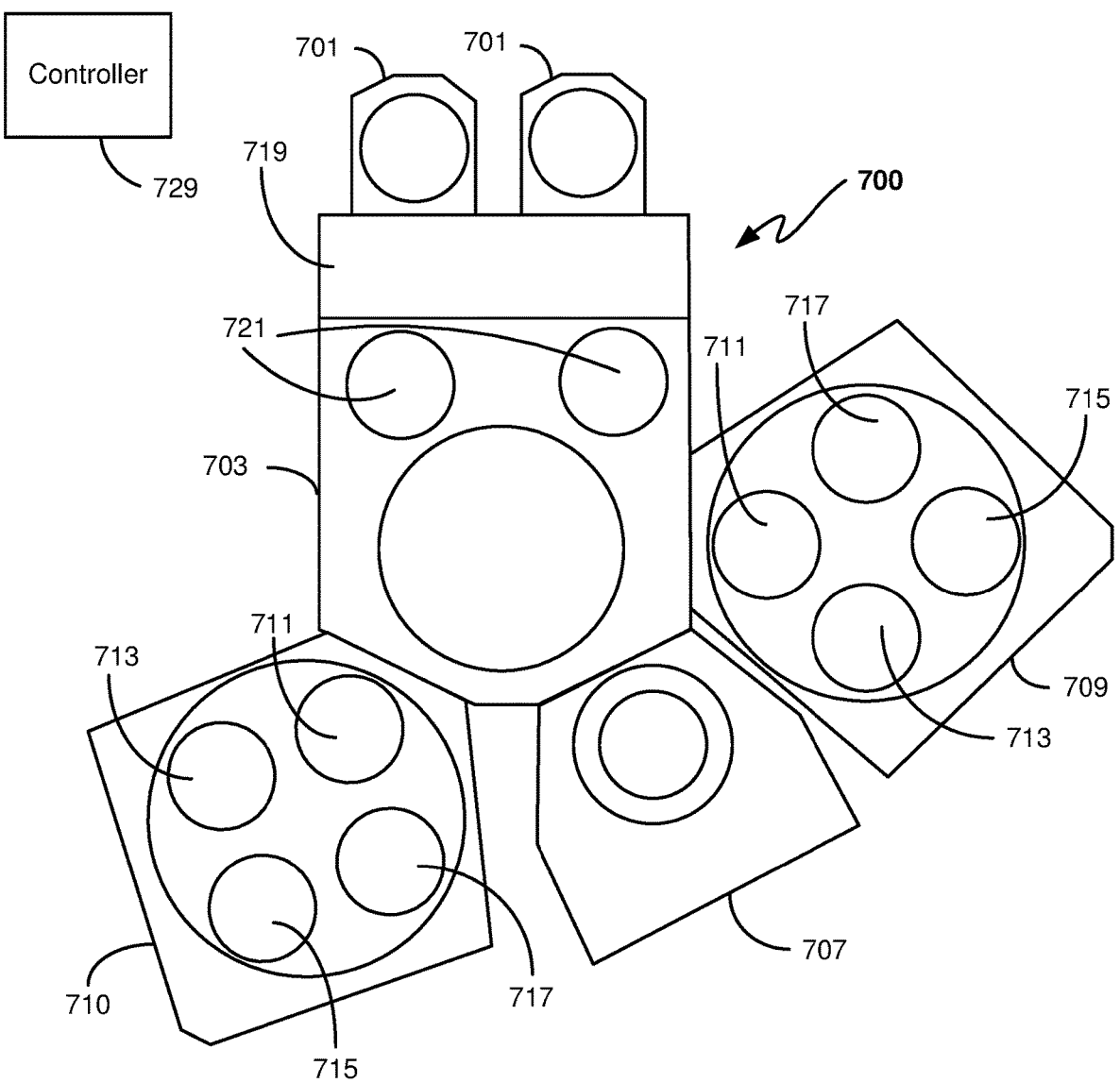
FIG. 7 shows a schematic illustration of a module cluster suitable for practicing various embodiments.

FIG. 7 is a block diagram of a processing system suitable for conducting thin film deposition processes in accordance with certain embodiments. The system 700 includes a transfer module 703. The transfer module 703 provides a clean, pressurized environment to minimize risk of contamination of substrates being processed as they are moved between various reactor modules. Mounted on the transfer module 703 are two multi-station reactors 709 and 710, each capable of performing atomic layer deposition (ALD) and/or chemical vapor deposition (CVD) according to certain embodiments. Reactors 709 and 710 may include multiple stations 711, 713, 715, and 717 that may sequentially or non-sequentially perform operations in accordance with disclosed embodiments. The stations may include a heated pedestal or substrate support, one or more gas inlets or showerhead or dispersion plate.

Also mounted on the transfer module 703 may be one or more single or multi-station modules 707 capable of performing plasma or chemical (non-plasma) pre-cleans, or any other processes described in relation to the disclosed methods. The module 707 may in some cases be used for various treatments to, for example, prepare a substrate for a deposition process. The module 707 may also be designed/configured to perform various other processes such as etching or polishing. The system 700 also includes one or more wafer source modules 701, where wafers are stored before and after processing. An atmospheric robot (not shown) in the atmospheric transfer chamber 719 may first remove wafers from the source modules 701 to loadlocks 721. A wafer transfer device (generally a robot arm unit) in the transfer module 703 moves the wafers from loadlocks 721 to and among the modules mounted on the transfer module 703.

In various embodiments, a system controller 729 is employed to control process conditions during deposition. The controller 729 will typically include one or more memory devices and one or more processors. A processor may include a CPU or computer, analog and/or digital input/output connections, stepper motor controller boards, etc.

The controller 729 may control all of the activities of the deposition apparatus. The system controller 729 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 729 may be employed in some embodiments.

Typically there will be a user interface associated with the controller 729. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 729. The signals for controlling the process are output on the analog and digital output connections of the deposition apparatus 700.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Definitions

By "aliphatic" is meant a hydrocarbon group having at least one carbon atom to 50 carbon atoms ($C_{1-50}$), such as one to 25 carbon atoms ($C_{1-25}$), or one to ten carbon atoms ($C_{1-10}$), and which includes alkanes (or alkyl), alkenes (or alkenyl), alkynes (or alkynyl), including cyclic versions thereof, and further including straight- and branched-chain arrangements, and all stereo and position isomers as well. Such an aliphatic can be unsubstituted or substituted with one or more groups, such as groups described herein for an alkyl group.

By "alkenyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon double bond, wherein the unsaturated monovalent hydrocarbon can be derived from removing one hydrogen atom from one carbon atom of a parent alkene. An alkenyl group can be branched, straight-chain, cyclic (e.g., cycloalkenyl), cis, or trans (e.g., E or Z). An exemplary alkenyl includes an optionally substituted $C_{2-24}$ alkyl group having one or more double bonds. The alkenyl group can be monovalent or multivalent (e.g., bivalent) by removing one or more hydrogens to form appropriate attachment to the parent molecular group or appropriate attachment between the parent molecular group and another substitution. The alkenyl group can also be substituted or unsubstituted. For example, the alkenyl group can be substituted with one or more substitution groups, as described herein for alkyl.

By "alkenylene" is meant a multivalent (e.g., bivalent) form of an alkenyl group, as defined herein. The alkenylene group can be substituted or unsubstituted. For example, the alkenylene group can be substituted with one or more substitution groups, as described herein for alkyl.

By "alkyl" is meant a saturated monovalent hydrocarbon having at least one carbon atom to 50 carbon atoms ($C_{1-50}$), such as one to 25 carbon atoms ($C_{1-25}$), or one to ten carbon atoms ($C_{1-10}$), wherein the saturated monovalent hydrocarbon can be derived from removing one hydrogen atom from one carbon atom of a parent compound (e.g., alkane). An alkyl group can be branched, straight-chain, or cyclic (e.g., cycloalkyl). An exemplary alkyl includes a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can also be substituted or unsubstituted. The alkyl group can be monovalent or multivalent (e.g., bivalent) by removing one or more hydrogens to form appropriate attachment to the parent molecular group or appropriate attachment between the parent molecular group and another substitution. For example, the alkyl group can be substituted with one, two, three or, in the case of alkyl groups of two carbons or more, four substituents independently selected from the group consisting of: (1) $C_{1-6}$ alkoxy (e.g., —O—R, in which R is $C_{1-6}$ alkyl); (2) $C_{1-6}$ alkylsulfinyl (e.g., —S(O)—R, in which R is $C_{1-6}$ alkyl); (3) $C_{1-6}$ alkylsulfonyl (e.g., —SO$_2$—R, in which R is $C_{1-6}$ alkyl); (4) amine (e.g., —C(O)NR$^1$R$^2$ or —NHCOR$^1$, where each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein); (5) aryl; (6) arylalkoxy (e.g., —O-L-R, in which L is alkyl and R is aryl); (7) aryloyl (e.g., —C(O)—R, in which R is aryl); (8) azido (e.g., —N$_3$); (9) cyano (e.g., —CN); (10) aldehyde (e.g., —C(O)H); (11) $C_{3-8}$ cycloalkyl; (12) halo; (13) heterocyclyl (e.g., as defined herein, such as a 5-, 6- or 7-membered ring containing one, two, three, or four non-carbon heteroatoms); (14) heterocyclyloxy (e.g., —O—R, in which R is heterocyclyl, as defined herein); (15) heterocyclyloyl (e.g., —C(O)—R, in which R is heterocyclyl, as defined herein); (16) hydroxyl (e.g., —OH); (17) N-protected amino; (18) nitro (e.g., —NO$_2$); (19) oxo (e.g., =O); (20) $C_{1-6}$ thioalkoxy (e.g., —S—R, in which R is alkyl); (21) thiol (e.g., —SH); (22) —CO$_2$R$^1$, where R$^1$ is selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (23) —C(O)NR$^1$R$^2$, where each of R$^1$ and R$^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (24) —SO$_2$R$^1$, where R$^1$ is selected from the group consisting of (a) $C_{1-6}$ alkyl, (b) $C_{4-18}$ aryl, and (c) $C_{1-6}$ alkyl-$C_{4-18}$ aryl (e.g., -L-R, in which L is $C_{1-6}$ alkyl and R is $C_{4-18}$ aryl); (25) —SO$_2$NR$^1$R$^2$, where each of R$^1$ and R$^2$ is, independently, selected from the group consisting of (a) hydrogen, (b) $C_{1-6}$ alkyl, (c) $C_{4-18}$aryl, and (d) $C_{1-6}$ alkyl-$C_{4-18}$aryl (e.g., -L-R, in which L is $C_{1-6}$ alkyl and R is $C_{4-18}$ aryl); (26) —$SiR^1R^2R^3$, where each of $R^1$ and $R^2$ and $R^3$ is, independently, selected from the group consisting of (a) hydrogen, (b) halo, such as F, Cl, Br, or I, (c) $C_{1-6}$ alkyl, (d) $C_{2-6}$ alkenyl, (e) $C_{2-6}$ alkynyl, or (f) $C_{1-6}$ alkoxy (e.g., —OR, in which R is $C_{1-6}$ alkyl); and (27) —$NR^1R^2$, where each of $R^1$ and $R^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{1-6}$ alkyl-$C_{1-18}$ aryl (e.g., -L-R, in which L is $C_{1-6}$ alkyl and R is $C_{4-18}$ aryl), (h) $C_{3-8}$ cycloalkyl, and (i) $C_{1-6}$ alkyl-$C_{3-8}$ cycloalkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group. The alkyl group can be a primary, secondary, or tertiary alkyl group substituted with one or more substituents (e.g., one or more halo or alkoxy). In some embodiments, the unsubstituted alkyl group is a $C_{1-3}$, $C_{1-6}$, $C_{1-12}$, $C_{1-16}$, $C_{1-18}$, $C_{1-20}$, or $C_{1-24}$ alkyl group.

By "alkylene" is meant a multivalent (e.g., bivalent) form of an alkyl group, as described herein. Exemplary alkylene groups include methylene, ethylene, propylene, butylene, etc. In some embodiments, the alkylene group is a $C_{1-3}$, $C_{1-6}$, $C_{1-12}$, $C_{1-16}$, $C_{1-18}$, $C_{1-20}$, $C_{1-24}$, $C_{2-3}$, $C_{2-6}$, $C_{2-12}$, $C_{2-16}$, $C_{2-18}$, $C_{2-20}$, or $C_{2-24}$ alkylene group. The alkylene group can be branched or unbranched. The alkylene group can also be substituted or unsubstituted. For example, the alkylene group can be substituted with one or more substitution groups, as described herein for alkyl.

By "alkyleneoxy" is meant an alkylene group, as defined herein, attached to the parent molecular group through an oxygen atom.

By "alkynyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon triple bond, wherein the unsaturated monovalent hydrocarbon can be derived from removing one hydrogen atom from one carbon atom of a parent alkyne. An alkynyl group can be branched, straight-chain, or cyclic (e.g., cycloalkynyl). An exemplary alkynyl includes an optionally substituted $C_{2-24}$ alkyl group having one or more triple bonds. The alkynyl group can be cyclic or acyclic and is exemplified by ethynyl, 1-propynyl, and the like. The alkynyl group can be monovalent or multivalent (e.g., bivalent) by removing one or more hydrogens to form appropriate attachment to the parent molecular group or appropriate attachment between the parent molecular group and another substitution. The alkynyl group can also be substituted or unsubstituted. For example, the alkynyl group can be substituted with one or more substitution groups, as described herein for alkyl.

By "alkynylene" is meant a multivalent (e.g., bivalent) form of an alkynyl group, as defined herein. The alkynylene group can be substituted or unsubstituted. For example, the alkynylene group can be substituted with one or more substitution groups, as described herein for alkyl.

By "aromatic" is meant a cyclic, conjugated group or moiety of, unless specified otherwise, from 5 to 15 ring atoms having a single ring (e.g., phenyl) or multiple condensed rings in which at least one ring is aromatic (e.g., naphthyl, indolyl, or pyrazolopyridinyl); that is, at least one ring, and optionally multiple condensed rings, have a continuous, delocalized π-electron system. Typically, the number of out of plane π-electrons corresponds to the Huckel rule (4n+2). The point of attachment to the parent structure typically is through an aromatic portion of the condensed ring system. Such an aromatic can be unsubstituted or substituted with one or more groups, such as groups described herein for an alkyl or aryl group. Yet other substitution groups can include aliphatic, haloaliphatic, halo, nitrate, cyano, sulfonate, sulfonyl, or others.

By "aryl" is meant an aromatic carbocyclic group comprising at least five carbon atoms to 15 carbon atoms ($C_{5-15}$), such as five to ten carbon atoms ($C_{5-10}$), having a single ring or multiple condensed rings, which condensed rings can or may not be aromatic provided that the point of attachment to a remaining position of the compounds disclosed herein is through an atom of the aromatic carbocyclic group. Aryl groups may be substituted with one or more groups other than hydrogen, such as aliphatic, heteroaliphatic, aromatic, other functional groups, or any combination thereof. Exemplary aryl groups include, but are not limited to, benzyl, naphthalene, phenyl, biphenyl, phenoxybenzene, and the like. The term aryl also includes heteroaryl, which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term non-heteroaryl, which is also included in the term aryl, defines a group that contains an aromatic group that does not contain a heteroatom. The aryl group can be substituted or unsubstituted. The aryl group can be substituted with one, two, three, four, or five substituents independently selected from the group consisting of: (1) $C_{1-6}$ alkanoyl (e.g., —C(O)—R, in which R is $C_{1-6}$ alkyl); (2) $C_{1-6}$ alkyl; (3) $C_{1-6}$ alkoxy (e.g., —O—R, in which R is $C_{1-6}$ alkyl); (4) $C_{1-6}$ alkoxy-$C_{1-6}$ alkyl (e.g., -L-O—R, in which each of L and R is, independently, $C_{1-6}$ alkyl); (5) $C_{1-6}$ alkylsulfinyl (e.g., —S(O)—R, in which R is $C_{1-6}$ alkyl); (6) $C_{1-6}$ alkylsulfinyl-$C_{1-6}$ alkyl (e.g., -L-S(O)—R, in which each of L and R is, independently, $C_{1-6}$ alkyl); (7) $C_{1-6}$ alkylsulfonyl (e.g., —$SO_2$—R, in which R is $C_{1-6}$ alkyl); (8) $C_{1-6}$ alkylsulfonyl-$C_{1-6}$ alkyl (e.g., -L-$SO_2$—R, in which each of L and R is, independently, $C_{1-6}$ alkyl); (9) aryl; (10) amine (e.g., —$NR^1R^2$, where each of $R^1$ and $R^2$ is, independently, selected from hydrogen, aliphatic, heteroaliphatic, haloaliphatic, haloheteroaliphatic, aromatic, as defined herein, or any combination thereof, or $R^1$ and $R^2$, taken together with the nitrogen atom to which each are attached, form a heterocyclyl group, as defined herein); (11) $C_{1-6}$ aminoalkyl (e.g., -$L^1$-$NR^1R^2$ or -$L^2$-C($NR^1R^2$)($R^3$)—$R^4$, in which $L^1$ is $C_{1-6}$ alkyl; L2 is a covalent bond or $C_{1-6}$ alkyl; each of $R^1$ and $R^2$ is, independently, selected from hydrogen, aliphatic, heteroaliphatic, haloaliphatic, haloheteroaliphatic, aromatic, as defined herein, or any combination thereof, or $R^1$ and $R^2$, taken together with the nitrogen atom to which each are attached, form a heterocyclyl group, as defined herein; and each of $R^3$ and $R^4$ is, independently, H or $C_{1-6}$ alkyl); (12) heteroaryl; (13) $C_{1-6}$ alkyl-$C_{4-18}$ aryl (e.g., -L-R, in which L is $C_{1-6}$ alkyl and R is $C_{4-18}$ aryl); (14) aryloyl (e.g., —C(O)—R, in which R is aryl); (15) azido (e.g., —$N_3$); (16) cyano (e.g., —CN); (17) $C_{1-6}$ azidoalkyl (e.g., -L-$N_3$, in which L is $C_{1-6}$ alkyl); (18) aldehyde (e.g., —C(O)H); (19) aldehyde-$C_{1-6}$ alkyl (e.g., -L-C(O)H, in which L is $C_{1-6}$ alkyl); (20) $C_{3-8}$ cycloalkyl; (21) $C_{1-6}$ alkyl-$C_{3-8}$ cycloalkyl (e.g., -L-R, in which L is $C_{1-6}$ alkyl and R is $C_{3-8}$ cycloalkyl); (22) halo; (23) $C_{1-6}$ haloalkyl (e.g., -$L^1$-X or -$L^2$-C(X)($R^1$)—$R^2$, in which $L^1$ is $C_{1-6}$ alkyl; $L^2$ is a covalent bond or $C_{1-6}$ alkyl; X is fluoro, bromo, chloro, or iodo; and each of $R^1$ and $R^2$ is, independently, H or $C_{1-6}$ alkyl); (24) heterocyclyl (e.g., as defined herein, such as a 5-, 6- or 7-membered ring containing one, two, three, or four non-carbon heteroatoms); (25) heterocyclyloxy (e.g., —O—R, in which R is heterocyclyl, as defined herein); (26) heterocyclyloyl (e.g., —C(O)—R, in which R is heterocyclyl, as defined herein); (27) hydroxyl (—OH); (28) $C_{1-6}$ hydroxyalkyl (e.g., -$L^1$-OH or -$L^2$-C(OH)($R^1$)—$R^2$, in which $L^1$ is $C_{1-6}$ alkyl; $L^2$ is a covalent bond or alkyl; and each of $R^1$ and $R^2$ is, independently, H or $C_{1-6}$ alkyl, as defined herein); (29) nitro; (30) $C_{1-6}$ nitroalkyl (e.g., -$L^1$-NO or -$L^2$-C(NO)($R^1$)—$R^2$, in which $L^1$ is $C_{1-6}$ alkyl; $L^2$ is a covalent bond or alkyl; and each of $R^1$ and $R^2$ is, independently, H or $C_{1-6}$ alkyl, as defined herein); (31) N-protected amino; (32) N-protected amino-$C_{1-6}$ alkyl; (33) oxo (e.g., =O); (34) $C_{1-6}$ thioalkoxy (e.g., —S—R, in which R is $C_{1-6}$ alkyl); (35) thio-$C_{1-6}$ alkoxy-$C_{1-6}$ alkyl (e.g., -L-S—R, in which each of L and R is, independently, $C_{1-6}$ alkyl); (36) —(CH$_2$)$_r$CO$_2$R$^1$, where r is an integer of from zero to four, and $R^1$ is selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (37) —(CH$_2$)$_r$CONR$^1$R$^2$, where r is an integer of from zero to four and where each $R^1$ and $R^2$ is independently selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (38) —(CH$_2$)$_r$SO$_2$R$^1$, where r is an integer of from zero to four and where $R^1$ is selected from the group consisting of (a) $C_{1-6}$ alkyl, (b) $C_{4-18}$ aryl, and (c) $C_{1-6}$ alkyl-$C_{4-18}$ aryl (e.g., -L-R, in which L is $C_{1-6}$ alkyl and R is $C_{4-18}$ aryl); (39) —(CH$_2$)$_r$SO$_2$NR$^1$R$^2$, where r is an integer of from zero to four and where each of $R^1$ and $R^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (40) —(CH$_2$)$_r$NR$^1$R$^2$, where r is an integer of from zero to four and where each of $R^1$ and $R^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{1-6}$ alkyl-$C_{4-18}$ aryl (e.g., -L-R, in which L is $C_{1-6}$ alkyl and R is $C_{4-18}$ aryl), (h) $C_{3-8}$ cycloalkyl, and (i) $C_{1-6}$ alkyl-$C_{3-8}$ cycloalkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group; (41) thiol (e.g., —SH); (42) perfluoroalkyl (e.g., —(CF$_2$)$_n$CF$_3$, in which n is an integer from 0 to 10); (43) perfluoroalkoxy (e.g., —O—(CF$_2$)$_n$CF$_3$, in which n is an integer from 0 to 10); (44) aryloxy (e.g., —O—R, in which R is aryl); (45) cycloalkoxy (e.g., —O—R, in which R is cycloalkyl); (46) cycloalkylalkoxy (e.g., —O-L-R, in which L is alkyl and R is cycloalkyl); (47) arylalkoxy (e.g., —O-L-R, in which L is alkyl and R is aryl); and (48) —SiR$^1$R$^2$R$^3$, where each of $R^1$ and $R^2$ and $R^3$ is, independently, selected from the group consisting of (a) hydrogen, (b) halo, such as F, Cl, Br, or I, (c) $C_{1-6}$ alkyl, (d) $C_{2-6}$ alkenyl, (e) $C_{2-6}$ alkynyl, or (f) $C_{1-6}$ alkoxy (e.g., —OR, in which R is $C_{1-6}$ alkyl). In particular embodiments, an unsubstituted aryl group is a $C_{4-18}$, $C_{4-14}$, $C_{4-12}$, $C_{4-10}$, $C_{6-18}$, $C_{6-14}$, $C_{6-12}$, or $C_{6-10}$ aryl group.

By "arylene" is meant a multivalent (e.g., bivalent) form of an aryl group, as described herein. Exemplary arylene groups include phenylene, naphthylene, biphenylene, triphenylene, diphenyl ether, acenaphthenylene, anthrylene, or phenanthrylene. In some embodiments, the arylene group is a $C_{4-18}$, $C_{4-14}$, $C_{4-12}$, $C_{4-10}$, $C_{6-18}$, $C_{6-14}$, $C_{6-12}$, or $C_{6-10}$ arylene group. The arylene group can be branched or unbranched. The arylene group can also be substituted or unsubstituted. For example, the arylene group can be substituted with one or more substitution groups, as described herein for aryl.

By "aryleneoxy" is meant an arylene group, as defined herein, attached to the parent molecular group through an oxygen atom.

By "cycloaliphatic" is meant an aliphatic group, as defined herein, that is cyclic. Such cycloaliphatic groups can be saturated or unsaturated.

By "cycloalkyl" is meant a monovalent saturated or unsaturated non-aromatic cyclic hydrocarbon group of from three to eight carbons, unless otherwise specified, and is exemplified by cyclopropyl, cyclobutyl, cyclopentyl, cyclohexyl, cycloheptyl, bicyclo[2.2.1. heptyl], and the like. The cycloalkyl group can also be substituted or unsubstituted. For example, the cycloalkyl group can be substituted with one or more groups including those described herein for alkyl.

By "cycloheteroaliphatic" is meant a heteroaliphatic group, as defined herein, that is cyclic. Such cycloheteroaliphatic groups can be saturated or unsaturated.

By "cycloheteroalkyl" is meant a monovalent saturated or unsaturated non-aromatic cyclic hydrocarbon group of from three to eight carbons and having at least one heteroatom, which can be selected from, but not limited to oxygen, nitrogen, sulfur, silicon, boron, selenium, phosphorous, and oxidized forms thereof within the group. The cycloheteroalkyl group can also be substituted or unsubstituted. For example, the cycloheteroalkyl group can be substituted with one or more groups including those described herein for alkyl.

By "heteroaliphatic" is meant an aliphatic group, as defined herein, including at least one heteroatom to 20 heteroatoms, such as one to 15 heteroatoms, or one to 5 heteroatoms, which can be selected from, but not limited to oxygen, nitrogen, sulfur, silicon, boron, selenium, phosphorous, and oxidized forms thereof within the group.

By "heteroalkyl," "heteroalkenyl," and "heteroalkynyl" is meant an alkyl, alkenyl, or alkynyl group (which can be branched, straight-chain, or cyclic), respectively, as defined herein, including at least one heteroatom to 20 heteroatoms, such as one to 15 heteroatoms, or one to 5 heteroatoms, which can be selected from, but not limited to, oxygen, nitrogen, sulfur, silicon, boron, selenium, phosphorous, and oxidized forms thereof within the group. The heteroalkyl, heteroalkenyl, and/or heteroalkynyl groups can also be substituted or unsubstituted. For example, the heteroalkyl, heteroalkenyl, and/or heteroalkynyl groups can be substituted with one or more groups including those described herein for alkyl.

By "heteroalkylene," "heteroalkenylene," and "heteroalkynylene" is meant an alkylene, alkenylene, or alkynylene group (which can be branched, straight-chain, or cyclic), respectively, as defined herein, including at least one heteroatom to 20 heteroatoms, such as one to 15 heteroatoms, or one to 5 heteroatoms, which can be selected from, but not limited to, oxygen, nitrogen, sulfur, silicon, boron, selenium, phosphorous, and oxidized forms thereof within the group. The heteroalkylene, heteroalkenylene, and/or heteroalkynylene groups can also be substituted or unsubstituted. For example, the heteroalkylene, heteroalkenylene, and/or heteroalkynylene groups can be substituted with one or more groups including those described herein for alkyl.

By "heterocyclyl" is meant a 3-, 4-, 5-, 6- or 7-membered ring (e.g., a 5-, 6- or 7-membered ring), unless otherwise specified, containing one, two, three, or four non-carbon heteroatoms (e.g., independently selected from the group consisting of nitrogen, oxygen, phosphorous, sulfur, selenium, or halo). The 3-membered ring has zero to one double bonds, the 4- and 5-membered ring has zero to two double bonds, and the 6- and 7-membered rings have zero to three double bonds. The term "heterocyclyl" also includes bicyclic, tricyclic and tetracyclic groups in which any of the above heterocyclic rings is fused to one, two, or three rings independently selected from the group consisting of an aryl ring, a cyclohexane ring, a cyclohexene ring, a cyclopentane ring, a cyclopentene ring, and another monocyclic heterocyclic ring, such as indolyl, quinolyl, isoquinolyl, tetrahydroquinolyl, benzofuryl, benzothienyl and the like. Heterocyclics include acridinyl, adenyl, alloxazinyl, azaadamantanyl, azabenzimidazolyl, azabicyclononyl, azacycloheptyl, azacyclooctyl, azacyclononyl, azahypoxanthinyl, azaindazolyl, azaindolyl, azecinyl, azepanyl, azepinyl, azetidinyl, azetyl, aziridinyl, azirinyl, azocanyl, azocinyl, azonanyl, benzimidazolyl, benzisothiazolyl, benzisoxazolyl, benzodiazepinyl, benzodiazocinyl, benzodihydrofuryl, benzodioxepinyl, benzodioxinyl, benzodioxanyl, benzodioxocinyl, benzodioxolyl, benzodithiepinyl, benzodithiinyl, benzodioxocinyl, benzofuranyl, benzophenazinyl, benzopyranonyl, benzopyranyl, benzopyrenyl, benzopyronyl, benzoquinolinyl, benzoquinolizinyl, benzothiadiazepinyl, benzothiadiazolyl, benzothiazepinyl, benzothiazocinyl, benzothiazolyl, benzothienyl, benzothiophenyl, benzothiazinonyl, benzothiazinyl, benzothiopyranyl, benzothiopyronyl, benzotriazepinyl, benzotriazinonyl, benzotriazinyl, benzotriazolyl, benzoxathiinyl, benzotrioxepinyl, benzoxadiazepinyl, benzoxathiazepinyl, benzoxathiepinyl, benzoxathiocinyl, benzoxazepinyl, benzoxazinyl, benzoxazocinyl, benzoxazolinonyl, benzoxazolinyl, benzoxazolyl, benzylsultamyl, benzylsultimyl, bipyrazinyl, bipyridinyl, carbazolyl (e.g., 4H-carbazolyl), carbolinyl (e.g., β-carbolinyl), chromanonyl, chromanyl, chromenyl, cinnolinyl, coumarinyl, cytdinyl, cytosinyl, decahydroisoquinolinyl, decahydroquinolinyl, diazabicyclooctyl, diazetyl, diaziridinethionyl, diaziridinonyl, diaziridinyl, diazirinyl, dibenzisoquinolinyl, dibenzoacridinyl, dibenzocarbazolyl, dibenzofuranyl, dibenzophenazinyl, dibenzopyranonyl, dibenzopyronyl (xanthonyl), dibenzoquinoxalinyl, dibenzothiazepinyl, dibenzothiepinyl, dibenzothiophenyl, dibenzoxepinyl, dihydroazepinyl, dihydroazetyl, dihydrofuranyl, dihydrofuryl, dihydroisoquinolinyl, dihydropyranyl, dihydropyridinyl, dihydroypyridyl, dihydroquinolinyl, dihydrothienyl, dihydroindolyl, dioxanyl, dioxazinyl, dioxindolyl, dioxiranyl, dioxenyl, dioxinyl, dioxobenzofuranyl, dioxolyl, dioxotetrahydrofuranyl, dioxothiomorpholinyl, dithianyl, dithiazolyl, dithienyl, dithiinyl, furanyl, furazanyl, furoyl, furyl, guaninyl, homopiperazinyl, homopiperidinyl, hypoxanthinyl, hydantoinyl, imidazolidinyl, imidazolinyl, imidazolyl, indazolyl (e.g., 1H-indazolyl), indolenyl, indolinyl, indolizinyl, indolyl (e.g., 1H-indolyl or 3H-indolyl), isatinyl, isatyl, isobenzofuranyl, isochromanyl, isochromenyl, isoindazoyl, isoindolinyl, isoindolyl, isopyrazolonyl, isopyrazolyl, isoxazolidiniyl, isoxazolyl, isoquinolinyl, isoquinolinyl, isothiazolidinyl, isothiazolyl, morpholinyl, naphthindazolyl, naphthindolyl, naphthiridinyl, naphthopyranyl, naphthothiazolyl, naphthothioxolyl, naphthotriazolyl, naphthoxindolyl, naphthyridinyl, octahydroisoquinolinyl, oxabicycloheptyl, oxauracil, oxadiazolyl, oxazinyl, oxaziridinyl, oxazolidinyl, oxazolidonyl, oxazolinyl, oxazolonyl, oxazolyl, oxepanyl, oxetanonyl, oxetanyl, oxetyl, oxtenayl, oxindolyl, oxiranyl, oxobenzoisothiazolyl, oxochromenyl, oxoisoquinolinyl, oxoquinolinyl, oxothiolanyl, phenanthridinyl, phenanthrolinyl, phenazinyl, phenothiazinyl, phenothienyl (benzothiofuranyl), phenoxathiinyl, phenoxazinyl, phthalazinyl, phthalazonyl, phthalidyl, phthalimidinyl, piperazinyl, piperidinyl, piperidonyl (e.g., 4-piperidonyl), pteridinyl, purinyl, pyranyl, pyrazinyl, pyrazolidinyl, pyrazolinyl, pyrazolopyrimidinyl, pyrazolyl, pyridazinyl, pyridinyl, pyridopyrazinyl, pyridopyrimidinyl, pyridyl, pyrimidinyl, pyrimidyl, pyronyl, pyrrolidinyl, pyrrolidonyl (e.g., 2-pyrrolidonyl), pyrrolinyl, pyrrolizidinyl, pyrrolyl (e.g., 2H-pyrrolyl), pyrylium, quinazolinyl, quinolinyl, quinolizinyl (e.g., 4H-quinolizinyl), quinoxalinyl, quinuclidinyl, selenazinyl, selenazolyl, selenophenyl, succinimidyl, sulfolanyl, tetrahydrofuranyl, tetrahydrofuryl, tetrahydroisoquinolinyl, tetrahydroisoquinolyl, tetrahydropyridinyl, tetrahydropyridyl (piperidyl), tetrahydropyranyl, tetrahydropyronyl, tetrahydroquinolinyl, tetrahydroquinolyl, tetrahydrothienyl, tetrahydrothiophenyl, tetrazinyl, tetrazolyl, thiadiazinyl (e.g., 6H-1,2,5-thiadiazinyl or 2H,6H-1,5,2-dithiazinyl), thiadiazolyl, thianthrenyl, thianyl, thianaphthenyl, thiazepinyl, thiazinyl, thiazolidinedionyl, thiazolidinyl, thiazolyl, thienyl, thiepanyl, thiepinyl, thietanyl, thietyl, thiiranyl, thiocanyl, thiochromanonyl, thiochromanyl, thiochromenyl, thiodiazinyl, thiodiazolyl, thioindoxyl, thiomorpholinyl, thiophenyl, thiopyranyl, thiopyronyl, thiotriazolyl, thiourazolyl, thioxanyl, thioxolyl, thymidinyl, thyminyl, triazinyl, triazolyl, trithianyl, urazinyl, urazolyl, uretidinyl, uretinyl, uricyl, uridinyl, xanthenyl, xanthinyl, xanthionyl, and the like, as well as modified forms thereof (e.g., including one or more oxo and/or amino) and salts thereof. The heterocyclyl group can be substituted or unsubstituted. For example, the heterocyclyl group can be substituted with one or more substitution groups, as described herein for aryl.

By "heterocyclyldiyl" is meant a bivalent form of a heterocyclyl group, as described herein. In one instance, the heterocyclyldiyl is formed by removing a hydrogen from a heterocyclyl group. Exemplary heterocyclyldiyl groups include piperdylidene, quinolinediyl, etc. The heterocyclyldiyl group can also be substituted or unsubstituted. For example, the heterocyclyldiyl group can be substituted with one or more substitution groups, as described herein for heterocyclyl.

As used herein, the terms "top," "bottom," "upper," "lower," "above," and "below" are used to provide a relative relationship between structures. The use of these terms does not indicate or require that a particular structure must be located at a particular location in the apparatus.

A person of ordinary skill in the art would recognize that the definitions provided above are not intended to include impermissible substitution patterns (e.g., methyl substituted with 5 different groups, and the like). Such impermissible substitution patterns are easily recognized by a person of ordinary skill in the art. Any functional group disclosed herein and/or defined above can be substituted or unsubstituted, unless otherwise indicated therein.

CONCLUSION

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Although the foregoing embodiments have been described in some detail for purposes of clarity of understanding, it will be apparent that certain changes and modifications may be practiced within the scope of the appended claims. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method for selective deposition comprising:
providing a surface of a semiconductor substrate including a first region and a second region, wherein the first region comprises a metal or a semiconductor and the second region comprises a different material than the first region;
introducing a silicon-containing inhibitor to the surface to provide an inhibitor layer on the first region, wherein the silicon-containing inhibitor comprises a formula $RSiHX^1X^2$, wherein R is an organic moiety and each of $X^1$ and $X^2$ is independently optionally substituted alkyl, optionally substituted alkenyl, optionally substituted alkynyl, optionally substituted cycloalkyl, or optionally substituted aryl; and
depositing a first layer on at least a portion of a non-inhibited surface comprising the second region.

2. The method of claim 1,
wherein the first region comprises the metal, and
wherein the second region comprises a dielectric or a semiconductor.

3. The method of claim 2, wherein at least one of:
(i) the first region comprises copper (Cu), cobalt (Co), tungsten (W), ruthenium (Ru), tantalum (Ta), titanium (Ti), hafnium (Hf), zirconium (Zr), and/or molybdenum (Mo), and
(ii) the second region comprises silicon (Si), silicon dioxide ($SiO_2$), doped $SiO_2$, silicon nitride, silicon carbide, silicon oxycarbide, silicon oxynitride, silicon carbon nitride, a low-K dielectric, germanium, silicon germanium, or germanium silicon.

4. The method of claim 1,
wherein the first region comprises the semiconductor, and
wherein the second region comprises a dielectric.

5. The method of claim 4, wherein at least one of:
(i) the first region comprises silicon (Si), germanium (Ge), silicon germanium (SiGe), doped Si, or doped Ge, and
(ii) the second region comprises silicon dioxide ($SiO_2$), doped $SiO_2$, silicon nitride, silicon carbide, silicon oxycarbide, silicon oxynitride, silicon carbon nitride, or a low-K dielectric.

6. The method of claim 1, wherein said introducing comprises a dose time of about 5 seconds to 600 seconds, a temperature of about 50° C. to 100° C., and/or a pressure of about 5 Torr to 10 Torr.

7. The method of claim 1, wherein the inhibitor layer comprises a self-assembled monolayer or a self-assembled multilayer.

8. The method of claim 1, wherein the organic moiety is or comprises optionally substituted aliphatic, optionally substituted heteroaliphatic, optionally substituted cycloaliphatic, optionally substituted cycloheteroaliphatic, optionally substituted aromatic, optionally substituted alkyl, optionally substituted alkenyl, optionally substituted alkynyl, optionally substituted heteroalkyl, optionally substituted heteroalkenyl, optionally substituted heteroalkynyl, optionally substituted cycloalkyl, optionally substituted cycloheteroalkyl, optionally substituted aryl, or optionally substituted heterocyclyl.

9. The method of claim 8, wherein at least one of:
(i) the organic moiety is or comprises a branched-chain hydrocarbon, (ii) the organic moiety comprises one or more halo substitutions, and
iii) the organic moiety comprises 6 to 20 carbon atoms within a linear chain, branched chain, or cyclic group.

10. The method of claim 8, wherein the organic moiety is or comprises —X-L-Z, and wherein:
X is a covalent bond, optionally substituted alkylene, optionally substituted alkenylene, optionally substituted alkynylene, optionally substituted alkyleneoxy, optionally substituted heteroalkylene, optionally substituted heteroalkenylene, optionally substituted heteroalkynylene, optionally substituted arylene, optionally substituted aryleneoxy, or optionally substituted heterocyclyldiyl;
L is a covalent bond, $—CR^1R^2—$, $—CR^1{=}CR^2—$, $—NR^1—$, $—C(O)—$, $—C(O)\ NR^1—$, $—NR^1C(O)—$, $—C(O)O—$, $—OC(O)—$, $—S—$, or $—O—$;
Z is hydrogen (H), optionally substituted alkyl, optionally substituted alkenyl, optionally substituted alkynyl, optionally substituted heteroalkyl, optionally substituted heteroalkenyl, optionally substituted heteroalkynyl, optionally substituted aryl, or optionally substituted heterocyclyl; and
each of $R^1$ and $R^2$ is, independently, H or optionally substituted alkyl.

11. The method of claim 1, wherein said depositing comprises atomic layer deposition (ALD) or chemical vapor deposition (CVD).

12. The method of claim 1,
wherein the first layer comprises an oxide, a metal oxide, a nitride, a metal nitride, a carbide, a metal carbide, or an oxynitride, and
wherein the first layer optionally comprises aluminum oxide, zinc oxide, zirconium oxide, hafnium oxide, silicon oxide, silicon oxynitride, silicon nitride, or titanium oxide.

13. The method of claim 1, wherein said introducing is conducted at a first temperature that is lower than a second temperature during said depositing.

14. The method of claim 1, further comprising before said introducing:
pre-treating the surface with a plasma.

15. The method of claim 1, further comprising before said depositing:
annealing the inhibitor layer at a temperature of from about 250° C. to 350° C.

16. The method of claim 1, further comprising after said depositing:
further depositing a second layer on at least a portion of a surface of the first layer or the non-inhibited surface.

17. The method of claim 1, further comprising after the depositing or after the further depositing:

post-treating the surface to remove the inhibitor layer; and optionally providing a patterned via comprising a metal, wherein the patterned via is configured to be electrically connected to the first region.

18. An apparatus for selective deposition, the apparatus comprising:

a processing chamber;

a substrate holder in the processing chamber;

one or more gas inlets for flowing gases into the processing chamber;

a vacuum source for removing gases from the processing chamber;

a plasma generator for generating a plasma within the processing chamber; and one or more controllers comprising machine-readable instructions for operating the one or more gas inlets, vacuum source, and plasma generator to deposit onto a semiconductor substrate, the machine-readable instructions of the one or more controllers comprising instructions for:

(a) optionally causing operation of the plasma generator to provide a plasma to pre-treat a surface of the semiconductor substrate;

(b) causing operation of the one or more gas inlets to flow a silicon-containing inhibitor into the processing chamber and provide an inhibitor layer on a first region of a semiconductor substrate held in the substrate holder, wherein the first region comprises a metal or a semiconductor, wherein the semiconductor substrate further comprises a second region comprising a different material than the first region, wherein the silicon-containing inhibitor comprises a formula $RSiHX^1X^2$, and wherein R is an organic moiety and each of $X^1$ and $X^2$ is independently optionally substituted alkyl, optionally substituted alkenyl, optionally substituted alkynyl, optionally substituted cycloalkyl, or optionally substituted aryl;

(c) causing operation of the vacuum source to remove at least some of the silicon-containing inhibitor from the processing chamber;

(d) optionally causing operation of the substrate holder to anneal the inhibitor layer at a temperature of from about 250° C. to 350° C.; and (e) causing operation of the one or more gas inlets to flow a first precursor to deposit a first layer on at least a portion of a non-inhibited surface comprising the second region.

19. The apparatus of claim 18, wherein the machine-readable instructions of the one or more controllers comprising instructions for:

(f) causing operation of the one or more gas inlets, after (e), to flow a second precursor to further deposit a second layer on at least a portion of a surface of the first layer or the non-inhibited surface; and (g) optionally causing operation of the plasma generator, after (e) or (f), to provide a plasma to post-treat a surface of the semiconductor substrate to remove the inhibitor layer.

20. An apparatus for selective deposition, the apparatus comprising:

a first processing chamber having a first substrate holder;

a second processing chamber having a second substrate holder;

a transfer module configured to transfer a semiconductor substrate from the first processing chamber to the second processing chamber;

one or more gas inlets for flowing gases into the first processing chamber and the second processing chamber;

a vacuum source for removing gases from the first processing chamber and/or the second processing chamber;

a plasma generator for generating a plasma within the first processing chamber and/or the second processing chamber; and one or more controllers comprising machine-readable instructions for operating the one or more gas inlets, vacuum source, and plasma generator to deposit onto the semiconductor substrate, the machine-readable instructions of the one or more controllers comprising instructions for:

(a) optionally causing operation of the plasma generator to provide a plasma to the first processing chamber to pre-treat a surface of the semiconductor substrate;

(b) causing operation of the one or more gas inlets to flow a silicon-containing inhibitor into the first processing chamber and provide an inhibitor layer on a first region of a semiconductor substrate held in the substrate holder, wherein the first region comprises a metal or a semiconductor, wherein the semiconductor substrate further comprises a second region comprising a different material than the first region, wherein the silicon-containing inhibitor comprises a formula $RSiHX^1X^2$, and wherein R is an organic moiety and each of $X^1$ and $X^2$ is independently optionally substituted alkyl, optionally substituted alkenyl, optionally substituted alkynyl, optionally substituted cycloalkyl, or optionally substituted aryl;

(c) causing operation of the vacuum source to remove at least some of the silicon-containing inhibitor from the first processing chamber;

(d) optionally causing operation of the first substrate holder to anneal the inhibitor layer at a temperature of from about 250° C. to 350° C.;

(e) causing operation of the transfer module to transfer the semiconductor substrate from the first processing chamber to the second processing chamber;

(f) optionally causing operation of the second substrate holder to anneal the inhibitor layer at a temperature of from about 250° C. to 350° C.;

(g) causing operation of the one or more gas inlets to flow a first precursor to the second processing chamber to deposit a first layer on at least a portion of a non-inhibited surface comprising the second region;

(h) optionally causing operation of the one or more gas inlets to flow a second precursor to the second processing chamber to further deposit a second layer on at least a portion of a surface of the first layer or the non-inhibited surface; and (i) optionally causing operation of the plasma generator, after (g) or (h), to provide a plasma to the second processing chamber to post-treat a surface of the semiconductor substrate to remove the inhibitor layer.

* * * * *